United States Patent
Enokido et al.

(10) Patent No.: US 7,330,582 B2
(45) Date of Patent: *Feb. 12, 2008

(54) BONDING PROGRAM

(75) Inventors: Satoshi Enokido, Hachioji (JP); Kenji Sugawara, Kokubunji (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/583,105

(22) Filed: Oct. 16, 2006

(65) Prior Publication Data

US 2007/0041632 A1    Feb. 22, 2007

Related U.S. Application Data

(62) Division of application No. 10/959,242, filed on Oct. 6, 2004, now Pat. No. 7,209,583.

(30) Foreign Application Priority Data

Oct. 7, 2003    (JP)    .............. 2003-348888

(51) Int. Cl.
    *G06K 9/00*    (2006.01)
(52) U.S. Cl. ............. 382/145; 156/351; 156/358; 228/103; 324/765; 382/218; 382/294
(58) Field of Classification Search .......... 156/351, 156/358; 228/4.5, 103; 324/765; 382/145, 382/147, 151, 218, 294
    See application file for complete search history.

(56) References Cited

U.S. PATENT DOCUMENTS 6,016,358 A * 1/2000 Balamurugan .............. 382/151
6,381,359 B1 * 4/2002 Hayata .............. 382/151
6,917,699 B2 * 7/2005 Sugawara .............. 382/151
7,224,829 B2 * 5/2007 Enokido .............. 382/145
2007/0036423 A1 * 2/2007 Enokido .............. 382/151
2007/0036424 A1 * 2/2007 Enokido .............. 382/151
2007/0036425 A1 * 2/2007 Enokido et al. ........... 382/151

FOREIGN PATENT DOCUMENTS

| JP | 63-56764 | 3/1988 |
| JP | 2864735 | 3/1999 |
| JP | 2002-208010 | 7/2002 |

* cited by examiner

*Primary Examiner*—Gregory M Desire
(74) *Attorney, Agent, or Firm*—William L. Androlia; H. Henry Koda

(57) ABSTRACT

With an assumption that the three data of the position $(X_1, Y_1)$ of the first positioning pattern 202 and position $(X_2, Y_2)$ of the second positioning pattern 212 of the reference chip 200, and the position $(X_3, Y_3)$ of the first positioning pattern 232 of the bonding object chip 230, as well as the length L of a line segment connecting $(X_1, Y_1)$ and $(X_2, Y_2)$, and the angle $\theta_2$ of this line segment with respect to the X axis, are known, the coordinates $(X_4, Y_4)$ of the center position of the imaging range 250 that is to be imaged next is determined by detecting the inclination-angle $\Delta\theta$ of the first positioning pattern 232 of the bonding object chip 230. Furthermore, the imaging range can be narrowed and the second positioning pattern 252 can be captured by increasing the precision of $\Delta\theta$.

2 Claims, 13 Drawing Sheets

BONDING PROGRAM

This application is a divisional of Ser. No. 10/959,242 now patent U.S. Pat. No. 7,209,583, filed Oct. 6, 2004.

BACKGROUND OF THE INVENTION

1. Technical Field

The present invention relates to bonding and more particularly to a bonding method, bonding apparatus and bonding program in which the positions of a plurality of positioning patterns disposed on a chip that is the object of bonding are respectively detected, the positions of bonding pads that are in a specified positional-relationship with the plurality of positioning patterns are calculated, and bonding is performed in the calculated bonding positions.

2. Description of the Related Art

In wire bonding between a plurality of bonding pads disposed on a chip and a plurality of bonding leads disposed on a circuit board, etc., on which the chip is mounted, the bonding of wires is accomplished by moving a bonding tool to the positions of the respective bonding pads and the positions of the respective bonding leads. As chips have become smaller and more highly integrated, the dimensions of bonding pads have become smaller and the spacing of such bonding pads has become narrower; accordingly, the accurate specification of the positions of the respective bonding pads has become necessary. Accordingly, position detection of bonding pads and the positioning patterns used in bonding is practiced.

However, when chips are disposed so that these chips are shifted in the direction of rotation, an inclination is generated in the positioning patterns, etc., so that accurate position detection cannot be accomplished, and wire bonding cannot be performed correctly. Japanese Patent Application Laid-Open (Kokai) No. S63-56764 discloses a method in which pattern matching between a reference-image prepared beforehand and the object-image is performed by successively rotating the reference-image from 0 to 360° for each pattern matching in cases where there is rotation, repeating pattern matching for each angle, and judging the locations and angles that show the best match as a result.

Furthermore, in the method of Japanese Patent No. 2864735, square regions that are to be compared are extracted from object-image signals obtained by imaging, the image signals contained in the extracted square regions are converted into image signals with polar coordinates by way of using the corners of the square regions as the origin, radial-direction patterns for respective specified angles and radial-direction patterns in the reference angles of reference-images prepared beforehand and subjected to a polar coordinate conversion are successively compared, and the comparative angle of the object-image is calculated.

Furthermore, in Japanese Patent Application Laid-Open (Kokai) No. 2002-208010, an approach using a rotation-resistant reference point is disclosed as a means for performing high-precision position detection without performing pattern matching in the rotational direction (which tends to involve an increase in the quantity of calculations) even in cases where the object of comparison is disposed in an attitude that includes positional deviation in the rotational direction. Here, according to Japanese Patent Application Laid-Open (Kokai) No. 2002-208010, the term "rotation-resistant reference point" refers to a point which is such that the error in the position of the object of comparison that is detected in pattern matching of the reference-image and an image of the object of comparison that is obtained by imaging the object of comparison disposed in an attitude that includes positional deviation in the direction of rotation shows a minimum value.

Furthermore, in Japanese Patent Application Laid-Open (Kokai) No. 2002-208010, it is indicated that normalized correlation calculations can be used as one method of pattern matching. Moreover, the following embodiment is indicated as a method for calculating the rotation-resistant reference point.

In the first embodiment, the rotation-resistant reference point is calculated as follows. Specifically, with one corner of the reference-image taken as the center, a rotated image that is rotated +Q° is produced, and the coordinates $(X_1, Y_1)$ of the point showing the best match as a result of pattern matching between this rotated image and the reference-image are determined. Similarly, a rotated image that is rotated −Q° is produced, and the coordinates $(X_2, Y_2)$ of the point showing the best match as a result of pattern matching between this rotated image and the reference-image are determined. The coordinates (AX1, AY1) of the rotation-resistant reference point are expressed by the following Equations (1) through (4) using the coordinates $(X_1, Y_1)$, $(X_2, Y_2)$ of these two points, the angle Q° and the coordinates (XC1, YC1) of the corner point taken as the center of rotation.

$$AX1 = XC1 + r\cos\alpha \quad (1)$$

$$AY1 = YC1 + r\sin\alpha \quad (2)$$

Here, $\alpha = \tan^{-1}\{(X_2-X_1)/(Y_1-Y_2)\}$ (3)

$$r = \sqrt{\{(X_2-X_1)^2 + (Y_1-Y_2)^2\}}/2\sin Q \quad (4)$$

The rotation-resistant reference point determined by this method is the center of the object in cases where the pattern used is the shape of the object. For example, in the case of a circle, the center point of the circle is the rotation-resistant reference point, and in the case of a square, the center point of the square is the rotation-resistant reference point.

The second embodiment is a simpler method for calculating the rotation-resistant reference point. Specifically, a plurality of rotational center points are set within the reference-image. Then, the reference-image is rotated +Q° about each rotational center point. The amounts of matching between the respective rotated images thus obtained and the reference-image are respectively calculated. Then, a rotational center point with a relatively large amount of matching (among the plurality of rotational center points) is taken as the rotation-resistant reference point. In this case, a rotational center point that is set in the vicinity of the center of the pattern used is taken as the rotation-resistant reference point.

It is indicated that the coordinates of points used in bonding can be determined with high precision, without any need to perform pattern matching in the rotational direction, by thus calculating the coordinates of the rotation-resistant reference point, and taking this point as a bonding alignment point, i.e., a bonding positioning point.

In regard to position detection of positioning patterns, etc., new techniques have been developed as shown below as a demand for increased wire bonding speed has appeared; along with these new techniques, new problems have arisen.

For example, as the scale of LSI has increased, the number of boning pads has increased, and detection of the individual positions of all of these pads takes time. Accordingly, a method is practiced in which only the positions of positioning patterns, at least two of which are spaced as widely as possible on the surface of the chip, are detected, the positions of the other bonding pads are obtained by calculation based upon these positions, and the calculated positions are taken as the bonding target positions.

Furthermore, in cases where wire bonding is performed for numerous types of chips, the storage in memory and read-out of the disposition of positioning patterns and bonding pads on the chip according to the type involved is also bothersome. Accordingly, a method in which a reference chip that acts as a reference for the type of chip involved is prepared when there is a change in the chip type, the disposition relationship of the positioning patterns and bonding pads is stored in memory as training for this reference chip, next, positioning patterns are imaged for the chip that is the object of bonding as the running state, and position detection is accomplished by pattern matching with the acquired image of the reference chip, is also practiced.

If an even greater increase in speed is required, a considerable processing time is required for the pattern recognition of a plurality of positioning patterns in the same visual field; accordingly, a method is performed in which only the areas in the vicinity of the respective positioning patterns are imaged, and positional detection is accomplished by performing pattern matching based upon these images.

Thus, as the speed progressively increases, the question of how to discriminate a plurality of positioning patterns and detect the positions of these patterns in a short time becomes an important performance factor in wire bonding apparatuses.

In this case, it has been demonstrated that if there is a deviation of the chip in the rotational direction, i.e., an inclination, this hinders an increase in the speed of position detection. The conditions of this problem will be described with reference to FIGS. 1 and 2, which show the relationship between the reference chip and the acquired image of the bonding chip. FIG. 1 shows a case in which the bonding object chip 230 is not inclined with respect to the reference chip 200, and FIG. 2 shows a case in which the bonding object chip 230 is inclined with respect to the reference chip 200. In FIGS. 1 and 2, the positioning patterns 202, 212, 232 and 252 are disposed on the upper left corners and lower right corners of the chips 200 and 230.

The training in regard to the reference chip 200 may be described as follows. A first reference-image 204 that includes the first positioning pattern 202 disposed on the upper left corner is acquired, and a second reference-image 214 that includes the second positioning pattern 212 disposed on the lower right corner is similarly acquired. These imaging-positions are detected by the wire bonding apparatus, and are respectively stored in memory as the center position 206 of the first reference-image and the center position 216 of the second reference-image. These center positions are treated as the position of the first positioning pattern 202 and the position of the second positioning pattern 212, and the respective positions of numerous bonding pads (not shown in the drawings) are calculated based upon these positions.

When training is completed, detection of the positioning patterns on the bonding object chip 230 is performed as a running step. First, the bonding object chip 230 is imaged in the position where the first positioning pattern 202 of the reference chip 200 was imaged. As shown in FIG. 1, a portion of the bonding object chip 230 is observed in this imaging range 220. Because of requirements for an increased optical magnification in order to ensure precision and the above-described increase in speed, this imaging range 220 is limited to a narrow range, so that the second positioning pattern 252 of the bonding object chip 230 is not observed. The position of the first positioning pattern 232 of the imaged bonding object chip 230 is shifted with respect to the position 206 of the first positioning pattern 202 of the reference chip 200. The position of the first positioning pattern 232 of the bonding object chip 230 can be determined by pattern matching, by moving the first reference-image 204 in parallel from the position 206, and using the moved position 236 of the first reference-image where this first positioning pattern 202 and the first positioning pattern 232 of the bonding object chip 230 show the greatest amount of overlapping.

Next, the camera must be moved in order to image the second positioning pattern of the bonding object chip 230. Besides the information that was acquired in training, i.e., the position 206 of the first positioning pattern 202 and position 216 of the second positioning pattern 212 of the reference chip 200, and the positions of the respective bonding pads calculated based upon these positions, the information that is obtained in this case is only the position 236 of the first positioning pattern of the bonding object chip 230. Accordingly, as shown in FIG. 1, with the point 236, point 206 and point 216 taken as three of the four points that form a parallelogram, the remaining one point 246 is calculated. This is viewed as the position of the second positioning pattern of the bonding object chip 230, and the center of the imaging range 240 of the camera is moved to this position.

In the case of FIG. 1, since the bonding object chip 230 is not inclined, the movement of the above-described camera involves no problem; the camera movement is performed at a high speed, and imaging of the second positioning pattern of the bonding object chip 230 is performed. If the bonding object chip 230 is inclined as shown in FIG. 2, then the position 256 of the actual second positioning pattern 252 may be located outside of the imaging range 240 of the moved camera. Especially in cases where an attempt is made to increase the speed by narrowing the imaging range, there is a possibility of an increased number of instances in which the second positioning pattern 252 that is to be imaged cannot be captured within the imaging range of the moved camera because of the effects of this inclination. If the second positioning pattern 252 is not captured within the imaging range 240, for example, the operator must perform a search while viewing the visual field of the camera after the apparatus is stopped by a recognition error, and must determine a position that allows the second positioning pattern to be captured. Accordingly, the processing time is greatly increased. If the imaging range is therefore made wider, the processing time required for pattern matching, etc., is increased. Furthermore, in order to broaden the imaging range, it is necessary to reduce the optical magnification, so that the problem of a drop in precision accompanying this reduction of the optical magnification also arises. Furthermore, in cases where a pattern resembling the reference pattern is present within a second visual field, there may be cases in which erroneous detection resulting from pattern matching with this similar pattern occurs. Accordingly, the following problem arises: namely, as a result of this erroneous detection, bonding cannot be performed in the desired pad positions on the chip, so that a defective product is manufactured.

Thus, in cases where there is a deviation of the chip in the direction of rotation, i.e., an inclination, this hinders the increase in the speed of movement to the imaging-position of the next positioning pattern, so that the productivity of the wire bonding apparatus cannot be improved. On the other hand, in the conventional techniques described in the above-described Japanese Patent Application Laid-Open (Kokai) No. S63-56764, Japanese Patent No. 2864735, and Japanese Patent Application Laid-Open (Kokai) No. 2002-208010, inclination-angle detection and position detection are performed with the acquired image as an object. Accordingly, there is no description of the capturing of the positioning pattern in the next imaging-position in any of these techniques.

Furthermore, in Japanese Patent Application Laid-Open (Kokai) No. S63-56764 and Japanese Patent No. 2864735, a detection of the inclination-angle is described; however, there is no description of the relationship between this inclination-angle and the capturing of the positioning pattern in the next imaging-position. In the method in which angle detection is performed using a polar coordinate conversion in Japanese Patent No. 2864735, the precision of inclination-angle detection is greatly influenced by the manner in which the origin is set. For example, in cases where the positioning patterns are circular, polar coordinate development can be performed with good reproducibility if the center of each circle is taken as the origin for polar coordinate development. However, there is no angular dependence of the development pattern, so that angle detection is in fact impossible. In cases where the positioning patterns have an asymmetrical shape, the conditions of the development pattern differ according to the location of the origin of polar coordinate development; as result, the precision of angle detection is affected. Japanese Patent No. 2864735 discloses a method in which respective polar coordinate conversions are performed for the four corners of square regions, and the inclination-angle is determined based upon these conversions. In this case, however, the processing time is long.

Furthermore, in the method of Japanese Patent Application Laid-Open (Kokai) No. 2002-208010, a rotation-resistant reference point is calculated, and this point is used as a bonding positioning point, makes it possible to determine the positions with a high degree of precision. However, the inclination-angles of the positioning patterns cannot be determined.

Thus, in the prior art, in cases where the positioning patterns have an inclination-angle, problems remain in terms of how to move quickly to the next imaging-position.

BRIEF SUMMARY OF THE INVENTION

The object of the present invention is to solve such problems encountered in the prior art, and to provide a bonding method, bonding apparatus and bonding program that make it possible to move to the next imaging-position at a higher speed even in cases where the positioning patterns have an inclination-angle.

The present invention is based on the results of an investigation of the question of where to locate the origin so as to improve the precision in the detection of the inclination-angle by way of using a polar coordinate conversion, focusing on the fact that a means for clarifying the relationship between the inclination-angle of one positioning pattern and the imaging-position of the next positioning pattern have been devised, and on the fact that the positioning processing time can be shortened as the precision of this inclination-angle is improved. First, the means for clarifying the relationship between the inclination-angle and the next imaging-position will be described; then, the principle involved in the improvement of the precision of the inclination-angle will be described.

The above object is accomplished by unique steps of the present invention for a bonding method that detects each one of positions of a plurality of positioning patterns disposed on a chip that is the object of bonding, calculates positions of bonding pads that are in a specified positional-relationship with the plurality of positioning patterns, and performs bonding in calculated positions of the bonding pads; and in the present invention, the bonding method includes:

a first reference-image acquisition step that makes an image of a first positioning pattern among the plurality of positioning patterns for a reference chip which is used as a reference for the detection of the positions of the positioning patterns, thus acquiring an image thus obtained as a first reference-image;

a first object-image acquisition step that makes an image of the first positioning pattern for a chip that is the object of bonding, thus acquiring an image thus as a first object-image;

a first positional-relationship calculation step that moves the first positioning pattern of the first reference-image and the first positioning pattern of the first object-image in relative terms so as to superimpose both of said images, so that a first positional-relationship which is the relative positional-relationship between the first positioning pattern of the reference chip and the first positioning pattern of the bonding object chip from the amount of said movement is calculated;

an inclination-angle calculation step that calculates an inclination-angle of the first positioning pattern of the bonding object chip with respect to the first positioning pattern in the reference chip;

a second reference-image acquisition step that makes an image of a second positioning pattern which is in a specified positional-relationship with the first positioning pattern for the reference chip, thus acquiring an image thus obtained as a second reference-image;

an imaging-position calculation step that calculates a second positioning pattern imaging-position in which the second positioning pattern is imaged for the chip that is the object of bonding, wherein said second positioning pattern imaging-position is calculated based upon the first positional-relationship, the inclination-angle, a specified inter-pattern positional-relationship and the imaging-position in the first object-image acquisition step;

a second object-image acquisition step that makes an image of the second positioning pattern for the bonding object chip in the calculated second positioning pattern imaging-position, thus acquiring the image thus obtained as a second object-image; and a second positional-relationship calculation step that moves the second reference-image and the second object-image in relative terms so as to superimpose the second positioning pattern of the second reference-image and the second positioning pattern of the second object-image, so that a second positional-relationship which is the relative positional-relationship between the second positioning pattern of the reference chip and the second positioning pattern of the bonding object chip from the amount of said movement is calculated; and positions of the bonding pads are calculated based upon the first positional-relationship and second positional-relationship, and bonding is performed.

In the above bonding method of the present invention, it is preferable that the inclination-angle calculation step include:

a reference conversion origin specifying step that specifies the conversion origin that is used to subject the first reference-image to a polar coordinate conversion;

a reference-image conversion step that performs a polar coordinate conversion on the first reference-image by way of using the specified reference conversion origin, thus producing a post-conversion reference-image;

an object conversion origin specifying step that specifies the conversion origin that is used to subject the first object-image to a polar coordinate conversion by a positional-relationship that is the same as the positional-relationship between the first positioning pattern and the reference conversion origin in the first reference-image, based upon the calculated first positional-relationship;

an object-image conversion step that performs a polar coordinate conversion on the first object-image by way of using the specified object conversion origin, thus producing a post-conversion object-image; and a relative inclination-angle calculation step that moves the post-conversion object-image and post-conversion reference-image in relative terms on the angular axis so that the first positioning pattern that has been subjected to a polar coordinate development in the post-conversion object-image and the first positioning pattern that has been subjected to a polar coordinate development in the post-conversion reference-image are superimposed, so that the relative inclination-angle between the positioning pattern of the reference chip and the positioning pattern of the bonding object chip is calculated from the angular amount of said movement; and the reference conversion origin specifying step include:

a rotated image acquisition step that acquires a rotated image produced by rotating the first reference-image through a specified angle, and a pattern matching step that moves the first reference-image and the rotated image in relative terms, thus performing pattern matching so that the positioning pattern of the first reference-image and the positioning pattern of the rotated image are superimposed; and a reference conversion origin. which is such that the error in the relative positional-relationship between the two positioning patterns detected by pattern matching of an image that is the object of comparison obtained by imaging-positioning patterns disposed in an attitude that includes positional deviation in the direction of rotation, and a first reference-image obtained by imaging-positioning patterns containing no positional deviation in the direction of rotation shows a minimal value, is specified, based upon the results of the pattern matching.

Furthermore, in the above-described bonding method of the present invention, it is preferable that:

the inclination-angle calculation step include:

a reference conversion origin specifying step that specifies the conversion origin that is used to subject the first reference-image to a polar coordinate conversion;

a reference-image conversion step that performs a polar coordinate conversion on the first reference-image by way of using the specified reference conversion, thus producing the post-conversion reference-image;

an object conversion origin specifying step that specifies the conversion origin that is used to subject the first object-image to a polar coordinate conversion by a positional-relationship that is the same as the positional-relationship between the first positioning pattern and the reference conversion origin in the first reference-image, based upon the calculated first positional-relationship;

an object-image conversion step that performs a polar coordinate conversion on the first object-image by way of using the specified object conversion origin, thus producing the post-conversion object-image; and a relative inclination-angle calculation step that moves the post-conversion image and post-conversion reference-image in relative terms on the angular axis so that the first positioning pattern that has been subjected to a polar coordinate development in the post-conversion object-image and the first positioning pattern that has been subjected to a polar coordinate development in the post-conversion reference-image are superimposed, thus calculating the relative inclination-angle between the positioning pattern of the reference chip and the positioning pattern of the bonding object chip from the angular amount of said movement; and the reference conversion origin specifying step include:

a rotational center point setting step that sets a plurality of rotational center points in arbitrary positions within the first reference-image, a rotated image acquisition step that acquires rotated images by rotating the first reference-image through a specified angle about each of the rotational center points, and a matching amount calculation step that calculates the amount of pattern matching which indicates, for each of the rotated images, the degree of overlapping between the positioning pattern of the rotated image and the positioning pattern of the first reference-image; and wherein a rotational center, whose pattern matching amount is within a specified range from a maximum value thereof, or a point, which is within a proximate region of said rotational center, is specified as a reference conversion origin in which an error in a relative positional-relationship between both positioning patterns detected by pattern matching of an image of an object of comparison, which is obtained by imaging a positioning pattern disposed in an attitude that includes positional deviation in the direction of rotation, and a reference-image, which is obtained by imaging a positioning pattern containing no positional deviation in the direction of rotation, shows a minimal value.

In addition, it is preferable that the above-described second object-image acquisition step image the second positioning pattern in an imaging range that is narrower than the imaging range used in the first object-image acquisition step.

The above-described object is also accomplished by a unique structure of the present invention for a bonding apparatus that detects each one of positions of a plurality of positioning patterns disposed on a chip that is the object of bonding, calculates positions of bonding pads that are in a specified positional-relationship with the plurality of positioning patterns, and performs bonding in calculated positions of the bonding pads; and in the present invention, the bonding apparatus includes:

a first reference-image acquisition means that makes an image of a first positioning pattern among the plurality of positioning patterns for a reference chip which is used as a reference for the detection of the positions of the positioning patterns, thus acquiring an image thus obtained as a first reference-image;

a first object-image acquisition means that makes an image of the first positioning pattern for a chip that is the object of bonding, thus acquiring an image thus as a first object-image;

a first positional-relationship calculation means that moves the first positioning pattern of the first reference-image and the first positioning pattern of the first object-image in relative terms so as to superimpose both of said images, so that a first positional-relationship which is the relative positional-relationship between the first positioning pattern of the reference chip and the first positioning pattern of the bonding object chip from the amount of said movement is calculated;

an inclination-angle calculation means that calculates an inclination-angle of the first positioning pattern of the bonding object chip with respect to the first positioning pattern in the reference chip;

a second reference-image acquisition means that makes an image of a second positioning pattern which is in a specified positional-relationship with the first positioning pattern for the reference chip, thus acquiring an image thus obtained as a second reference-image;

an imaging-position calculation means that calculates a second positioning pattern imaging-position in which the second positioning pattern is imaged for the chip that is the object of bonding, wherein said second positioning pattern imaging-position is calculated based upon the first positional-relationship, the inclination-angle, a specified inter-pattern positional-relationship and the imaging-position in the first object-image acquisition step;

a second object-image acquisition means that makes an image of the second positioning pattern for the bonding object chip in the calculated second positioning pattern imaging-position, thus acquiring the image thus obtained as a second object-image; and a second positional-relationship calculation means that moves the second reference-image and the second object-image in relative terms so as to superimpose the second positioning pattern of the second reference-image and the second positioning pattern of the second object-image, so that a second positional-relationship which is the relative positional-relationship between the second positioning pattern of the reference chip and the second positioning pattern of the bonding object chip from the amount of said movement is calculated; and positions of the bonding pads are calculated based upon the first positional-relationship and second positional-relationship, and bonding is performed.

In the above structure of the bonding apparatus of the present invention, it is preferable that the inclination-angle calculation means include:

a reference conversion origin specifying means that specifies the conversion origin that is used to subject the first reference-image to a polar coordinate conversion;

a reference-image conversion means that performs a polar coordinate conversion on the first reference-image by way of using the specified reference conversion origin, thus producing a post-conversion reference-image;

an object conversion origin specifying means that specifies the conversion origin that is used to subject the first object-image to a polar coordinate conversion by a positional-relationship that is the same as the positional-relationship between the first positioning pattern and the reference conversion origin in the first reference-image, based upon the calculated first positional-relationship;

an object-image conversion means that performs a polar coordinate conversion on the first object-image by way of using the specified object conversion origin, thus producing a post-conversion object-image; and a relative inclination-angle calculation means that moves the post-conversion object-image and post-conversion reference-image in relative terms on the angular axis so that the first positioning pattern that has been subjected to a polar coordinate development in the post-conversion object-image and the first positioning pattern that has been subjected to a polar coordinate development in the post-conversion reference-image are superimposed, so that the relative inclination-angle between the positioning pattern of the reference chip and the positioning pattern of the bonding object chip is calculated from the angular amount of said movement; and the reference conversion origin specifying means include:

a rotated image acquisition means that acquires a rotated image produced by rotating the first reference-image through a specified angle, and a pattern matching means that moves the first reference-image and the rotated image in relative terms, thus performing pattern matching so that the positioning pattern of the first reference-image and the positioning pattern of the rotated image are superimposed; and a reference conversion origin, which is such that an error in the relative positional-relationship between the two positioning patterns detected by pattern matching of an image that is the object of comparison obtained by imaging-positioning patterns disposed in an attitude that includes positional deviation in the direction of rotation, and a first reference-image obtained by imaging-positioning patterns containing no positional deviation in the direction of rotation shows a minimal value, is specified, based upon the results of the pattern matching Furthermore, the above-described object is accomplished by unique processes of the present invention for a bonding program that detects each one of positions of a plurality of positioning patterns disposed on a chip that is the object of bonding, calculates positions of bonding pads that are in a specified positional-relationship with the plurality of positioning patterns, and performs bonding in calculated positions of the bonding pads; and in the present invention, the bonding program includes:

a first reference-image acquisition process that makes an image of a first positioning pattern among the plurality of positioning patterns for a reference chip which is used as a reference for the detection of the positions of the positioning patterns, thus acquiring an image thus obtained as a first reference-image;

a first object-image acquisition process that makes an image of the first positioning pattern for a chip that is the object of bonding, thus acquiring an image thus as a first object-image;

a first positional-relationship calculation process that moves the first positioning pattern of the first reference-image and the first positioning pattern of the first object-image in relative terms so as to superimpose both of the images, so that a first positional-relationship which is the relative positional-relationship between the first positioning pattern of the reference chip and the first positioning pattern of the bonding object chip from the amount of said movement is calculated;

an inclination-angle calculation process that calculates an inclination-angle of the first positioning pattern of the bonding object chip with respect to the first positioning pattern in the reference chip;

a second reference-image acquisition process that makes an image of a second positioning pattern which is in a specified positional-relationship with the first positioning pattern for the reference chip, thus acquiring an image thus obtained as a second reference-image;

an imaging-position calculation process that calculates a second positioning pattern imaging-position in which the second positioning pattern is imaged for the chip that is the object of bonding, wherein said second positioning pattern imaging-position is calculated based upon the first positional-relationship, the inclination-angle, a specified inter-pattern positional-relationship and the imaging-position in the first object-image acquisition step;

a second object-image acquisition process that makes an image of the second positioning pattern for the bonding object chip in the calculated second positioning pattern imaging-position, thus acquiring the image thus obtained as a second object-image; and a second positional-relationship calculation process that moves the second reference-image and the second object-image in relative terms so as to superimpose the second positioning pattern of the second reference-image and the second positioning pattern of the second object-image, so that a second positional-relationship which is the relative positional-relationship between the second positioning pattern of the reference chip and the second positioning pattern of the bonding object chip from the amount of said movement is calculated; and positions of the bonding pads are calculated based upon the first positional-relationship and second positional-relationship, and bonding is performed.

In the above bonding program of the present invention, it is preferable that the inclination-angle calculation process include:
  a reference conversion origin specifying process that specifies the conversion origin that is used to subject the first reference-image to a polar coordinate conversion;
  a reference-image conversion process that performs a polar coordinate conversion on the first reference-image by way of using the specified reference conversion origin, thus producing a post-conversion reference-image;
  an object conversion origin specifying process that specifies the conversion origin that is used to subject the first object-image to a polar coordinate conversion by a positional-relationship that is the same as the positional-relationship between the first positioning pattern and the reference conversion origin in the first reference-image, based upon the calculated first positional-relationship;
  an object-image conversion process that performs a polar coordinate conversion on the first object-image by way of using the specified object conversion origin, thus producing a post-conversion object-image; and
  a relative inclination-angle calculation process that moves the post-conversion object-image and post-conversion reference-image in relative terms on the angular axis so that the first positioning pattern that has been subjected to a polar coordinate development in the post-conversion object-image and the first positioning pattern that has been subjected to a polar coordinate development in the post-conversion reference-image are superimposed, so that the relative inclination-angle between the positioning pattern of the reference chip and the positioning pattern of the bonding object chip is calculated from the angular amount of said movement; and the reference conversion origin specifying process include:
  a rotated image acquisition process that acquires a rotated image produced by rotating the first reference-image through a specified angle, and
  a pattern matching process that moves the first reference-image and the rotated image in relative terms, thus performing pattern matching so that the positioning pattern of the first reference-image and the positioning pattern of the rotated image are superimposed; and a reference conversion origin, which is such that the error in the relative positional-relationship between the two positioning patterns detected by pattern matching of an image that is the object of comparison obtained by imaging-positioning patterns disposed in an attitude that includes positional deviation in the direction of rotation, and a first reference-image obtained by imaging-positioning patterns containing no positional deviation in the direction of rotation, shows a minimal value, is specified, based upon the results of the pattern matching.

As seen from the above, in the present invention, the inclination-angle of the first positioning pattern of the bonding object chip is calculated, and the imaging range of the next second positioning pattern is calculated based upon this inclination-angle. Accordingly, even in cases where the positioning patterns have an inclination-angle, more rapid movement of the camera to the next imaging-position is possible, and the speed of bonding increases even further.

Furthermore, in the detection of the inclination-angle, a point which is such that the error in the position of the object of comparison that is detected by pattern matching between the reference-image and a comparison object-image obtained by imaging an object of comparison that is disposed in an attitude that includes positional deviation in the direction of rotation shows a minimum value is used as the origin of the polar coordinate conversion; as a result, the inclination of the bonding positioning pattern can be detected more quickly and with greater precision. Accordingly, even in cases where the positioning patterns have an inclination-angle, the camera can be moved even more quickly to the next imaging-position, and the speed of bonding can be increased even further.

Furthermore, since the inclination of the bonding positioning pattern can be detected with greater precision, the next imaging range can be made narrower. Accordingly, the processing time can be reduced even further.

DETAILED DESCRIPTION OF THE INVENTION

1. Relationship Between Inclination-Angle and Imaging-Position

Figure 2:
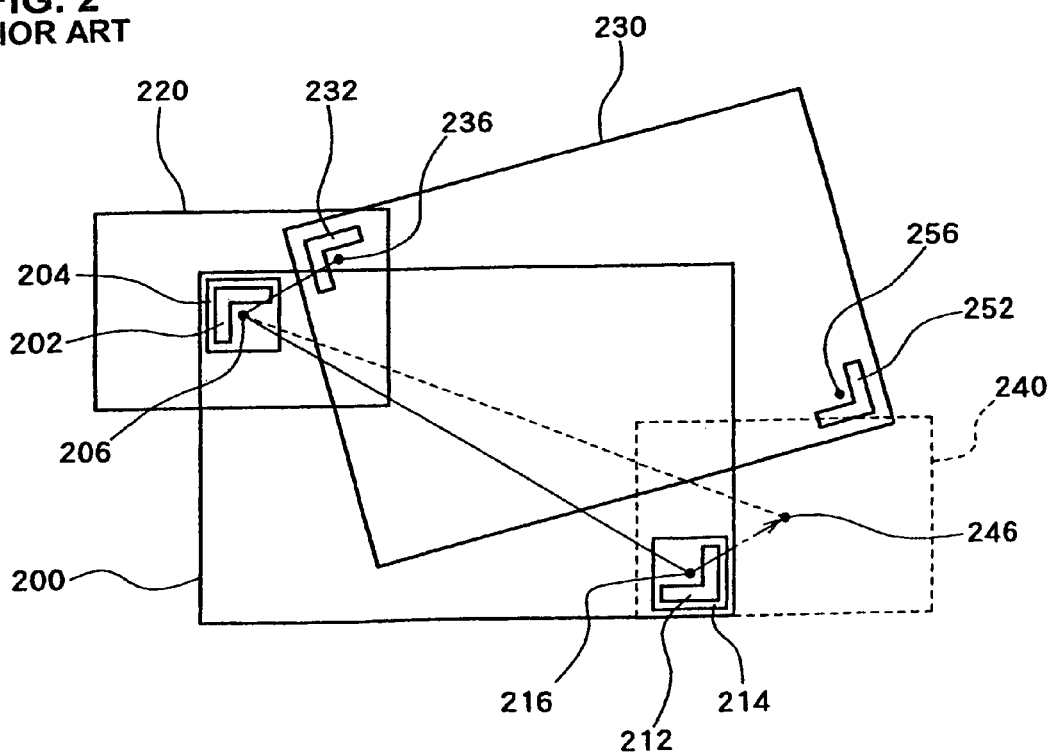
FIG. 2 shows how the positioning patterns are disposed in a case where the bonding object chip is inclined with respect to the reference chip in the related art.
Figure 3:
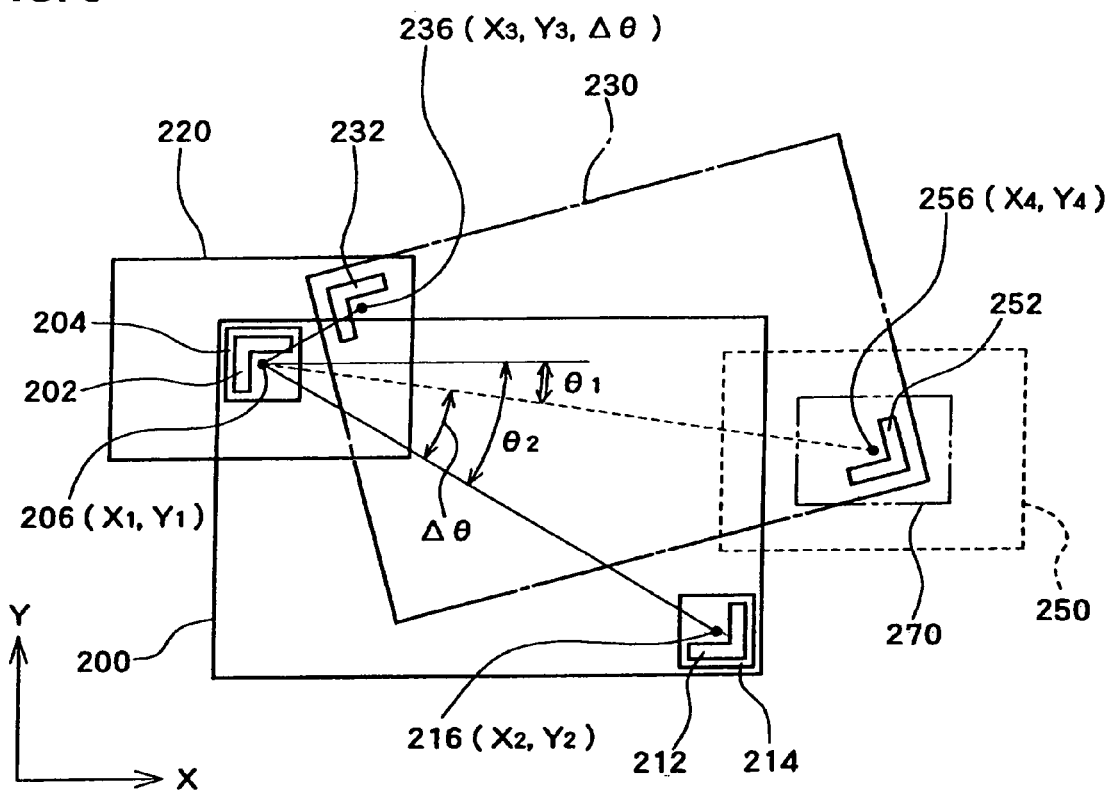
FIG. 3 shows how the center position of the imaging range that is to be imaged next is determined according to the principle of the present invention.

FIG. 3 shows how the coordinates $(X_4, Y_4)$ of the position 256 of the second positioning pattern of the bonding object chip 230 which is the center position of the imaging range 250 that is to be imaged next are determined from the three data of the coordinates $(X_1, Y_1)$ of the position 206 of the first positioning pattern 202 and coordinates $(X_2, Y_2)$ of the position 216 of the second positioning pattern 212 of the reference chip 200, and the coordinates $(X_3, Y_3)$ of the position 236 of the first positioning pattern 232 of the bonding object chip 230, in a disposition relationship similar to that of FIG. 2. The X axis and Y axis are taken in the directions shown in FIG. 3.

Here, it is assumed that the length L of a line segment connecting the position coordinates $(X_1, Y_1)$ of the first positioning pattern 202 and the position coordinates $(X_2, Y_2)$ of the position 216 of the second positioning pattern 212 in the reference chip 200, and the angle $\theta_2$ of this line segment with respect to the X axis, are already known; furthermore, it is assumed that the inclination-angle $\Delta\theta$ of the first positioning pattern 232 of the bonding object chip 230 is determined using a conventional technique.

Accordingly, if the angle with respect to the X axis of a line segment connecting the coordinates $(X_3, Y_3)$ of the position 236 of the first positioning pattern 232 and the coordinates $(X_4, Y_4)$ of the position 256 of the second positioning pattern 252 in the bonding object chip 230 is designated as $\theta_1$, the following relationship equations hold true:

$$\theta_1 = \theta_2 + \Delta\theta \quad (5)$$

$$\theta_2 = \arctan\{(Y_2 - Y_1)/(X_2 - X_1)\} \quad (6)$$

$$L = \sqrt{\{(X_2 - X_1)^2 + (Y_2 - Y_1)^2\}} \quad (7)$$

$$X_4 = X_3 + L\cos\theta_1 \quad (8)$$

$$Y_4 = Y_3 + L\sin\theta_1 \quad (9)$$

Thus, by detecting the inclination-angle $\Delta\theta$ of the first positioning pattern 232 of the bonding object chip 230, and performing the calculations of Equations (5) through (9) based upon this detected angle, it is possible to obtain $(X_4, Y_4)$, which are the center position coordinates of the next imaging range 250. By moving the camera to this position at a high speed, it is possible to capture the next positioning pattern 252 in the center of the imaging range of the camera even if the first positioning pattern 232 of the bonding object chip 230 is inclined.

2. Principle of Improvement of Precision of Inclination-Angle

The next positioning pattern 252 can be captured in the center of the imaging range of the camera by way of using the above-described relationship between the inclination-angle and the imaging-position; in this case, this positioning pattern can be captured further toward the center of the imaging range as the detection precision of the inclination-angle is improved. Specifically, even if the imaging range is narrowed, the next positioning pattern 252 can be captured in this range, and the processing time required for positioning can be shortened even further. Accordingly, the improvement of the precision of the inclination-angle will be described next.

The present invention is based on the results of an investigation of the question of where to locate the origin in the detection of angles by way of using a polar coordinate conversion in order to achieve greater precision. In the prior art, as described above, the precision is influenced by the manner in which the origin is established in performing a polar coordinate conversion. Accordingly, when a point showing relative immunity to the effects of rotation was investigated, the rotation-resistant reference point of Japanese Patent Application Laid-Open (Kokai) No. 2002-208010 attracted attention. The rotation-resistant reference point in the same reference is not used to determine angles. However, as described above, this point is "a point which is such that the error in the position of the object of comparison that is detected in pattern matching of the reference-image and an image of the object of comparison that is obtained by imaging the object of comparison disposed in an attitude that includes positional deviation in the direction of rotation shows a minimum value".

Accordingly, it was thought that this point could be viewed as a point that is relatively unaffected even if there is rotation, and that it might be possible to perform a stable polar coordinate conversion even in the case of asymmetrical patterns by way of using this point as the origin of the polar coordinate conversion. As a result of this investigation, it was found that inclination-angles can be detected with good precision, while reducing the quantity of calculations required, by taking this rotation-resistant reference point as origin of the polar coordinate conversion. This will be described in detail below with reference to the accompanying drawings.

First, the fact that it is difficult to determine inclination-angles with sufficient precision even if a positional reference point determined by ordinary pattern matching is used as the origin of a polar coordinate conversion will be illustrated using FIGS. 4 through 7. Next, the fact that inclination-angles can be determined with good precision if a rotation-resistant reference point is used as the origin of this polar coordinate conversion will be illustrated using FIGS. 8 through 10.

Figure 4:
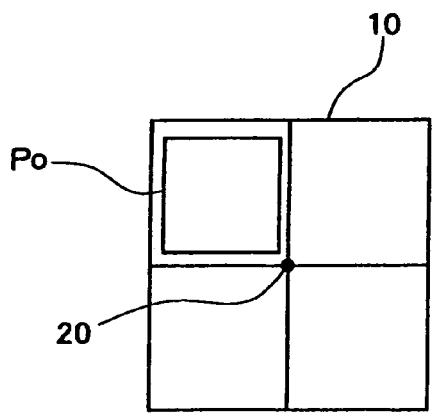
FIG. 4 shows the reference-image.

FIG. 4 shows the conditions of a reference-image 10 that is imaged so as to include a positioning pattern Po. For example, an image that is obtained by imaging the positioning pattern Po with a reference chip used as a positioning reference in a reference position is used as the reference-image 10. In the example shown in FIG. 4, the positioning pattern Po is imaged as a square pattern that is parallel to the longitudinal axis and horizontal axis of the reference-image. For example, the center position 20 of the reference-image 10 can be taken as an indicator of the position of the positioning pattern Po. Here, furthermore, the "positioning pattern Po" refers not to the positioning pattern that is used to position the image itself, but rather to the portion of the positioning pattern that is imaged within the image. However, this is abbreviated, and is simply called the "positioning pattern". Accordingly, when the term "positioning pattern" is used below, there may be cases in which this indicates the positioning pattern on the surface of the chip prior to imaging, and cases in which this indicates the portion of the positioning pattern that is imaged within the image following the imaging of this positioning pattern.

Figure 5A:
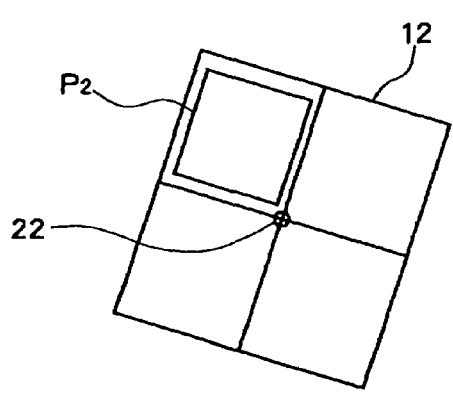
FIGS. 5A and 5B show how a positioning pattern disposed at an inclination as the object of comparison is imaged, and how the position of the positioning pattern constituting the object of comparison is determined by pattern matching with the reference-image.

FIG. 5A shows the conditions of a positioning pattern $P_2$ that is disposed at an inclination as the object of comparison. When imaging is performed with a camera, only the positioning pattern $P_2$ disposed at an inclination is obtained. Here, the image region corresponding to FIG. 4 is indicated as the image region 12 in FIG. 5A, and the center position of this image region 12 is indicated as 22. Since the image region 12 and center position 22 vary in association with the inclination of the positioning pattern, the center position 22 in FIG. 5A indicates the true position of the positioning pattern $P_2$ disposed at an inclination.

Figure 5B:
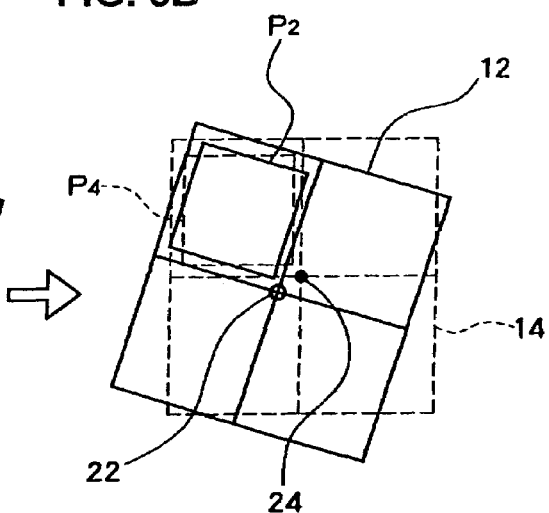

FIG. 5B shows how the position of the positioning pattern $P_2$ that is the object of comparison is determined by pattern matching. In pattern matching, the reference-image 10 is moved parallel to the longitudinal axis and horizontal axis so that the positioning pattern $P_0$ and positioning pattern $P_2$ disposed at an inclination are superimposed. Since the two positioning patterns are inclined with respect to each other, the positioning patterns are not completely superimposed. However, the movement is stopped in the position showing the greatest degree of overlapping. The positioning pattern $P_4$ following movement in this case is shown along with the reference-image 14 and center position 24 in FIG. 5B. In pattern matching, the center position 24 in this case is taken as an indicator of the position of the positioning pattern $P_2$ that is the object of comparison. Specifically, the difference between the center position 20 taken as a positioning reference and the center position 24 obtained by pattern matching as described above is taken as an indicator of the positional deviation between the positioning pattern $P_0$ of the reference-image and the positioning pattern $P_2$ that is the object of comparison.

As shown in FIG. 5B, the center position 24 that is taken as the position of the positioning pattern $P_2$ that is the object of comparison in pattern matching differs from the center position 22 that is the true position of the positioning pattern $P_2$ constituting the object of comparison. If the positioning pattern that is the object of comparison is not inclined, then such a difference is not generated. However, if the positioning pattern that is the object of comparison is disposed at an inclination, then a difference is generated between the position of the object of comparison thus determined by pattern matching and the true position.

Figure 6A:
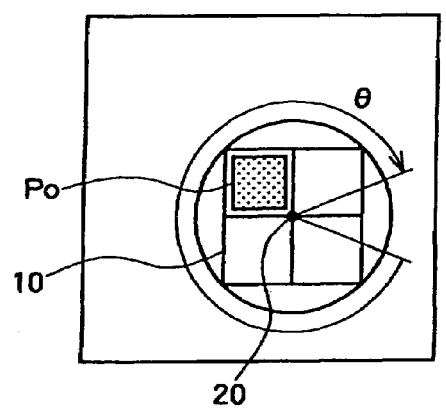
FIGS. 6A and 6B show the conditions of the polar coordinate conversion of the reference-image according to the present invention.
Figure 6B:
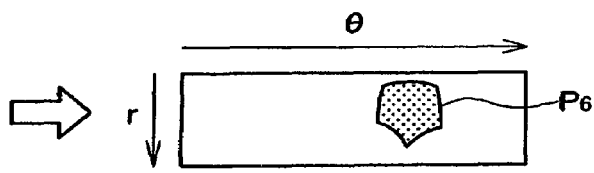
Figure 7A:
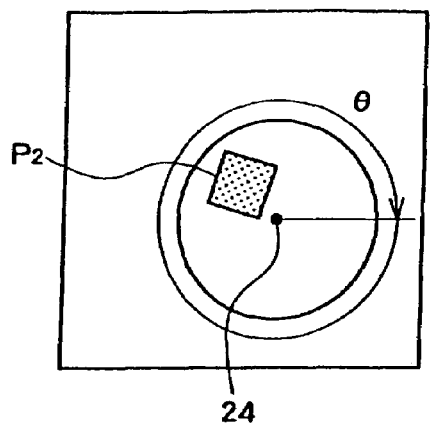
FIGS. 7A and 7B show the conditions of the polar coordinate conversion of the object-image according to the present invention.
Figure 7B:
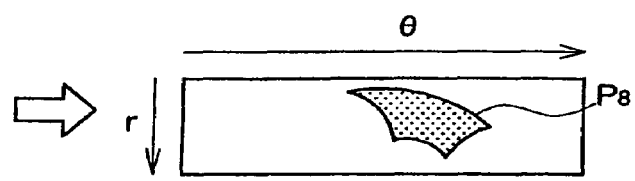

The conditions of the polar coordinate conversion of the positioning patterns $P_0$ and $P_2$ are shown in FIGS. 6 and 7. FIGS. 6A and 7A show the positioning patterns $P_0$ and $P_2$ prior to the polar coordinate conversion, and FIGS. 6B and 7B show the positioning patterns $P_6$ and $P_8$ following the polar coordinate conversion, using the axis in the direction of the radius r and the axis in the direction of the angle θ. FIGS. 6A and 6B show the conditions of the polar coordinate conversion of the positioning pattern $P_0$ of the reference-image 10. The center position 20 illustrated in FIG. 4 is used as the origin of the polar coordinate conversion. FIGS. 7A and 7B show the conditions of the polar coordinate conversion of the positioning pattern $P_2$ that is disposed at an inclination; the center position 24 obtained in the pattern matching illustrated in FIG. 5 is used as the origin of the polar coordinate conversion in this case.

The relative inclination-angle between the positioning patterns $P_0$ and $P_2$ is determined from a comparison of the positioning patterns $P_6$ and $P_8$ following the polar coordinate conversion. Specifically, both positioning patterns $P_6$ and $P_8$ are caused to move in relative terms along the angular axis, and this movement is stopped in the position where the positioning patterns show the greatest degree of overlapping; the inclination-angle can be determined based upon the movement angle. However, the positioning pattern $P_6$ shown in FIG. 6B and the positioning pattern $P_8$ shown in FIG. 7B differ considerably in terms of the conditions of these positioning patterns, so that the inclination-angle cannot be determined with sufficient precision even if pattern matching is performed on the angular axis. If the center position 22 indicating the true position illustrated in FIG. 5 is taken as the origin of the polar coordinate conversion in FIG. 7A, then the conditions of the positioning pattern following this polar coordinate conversion are close to those shown in FIG. 6B; accordingly, it may be predicted that the inclination-angle can be determined with some degree of precision. However, since the inclination of the positioning pattern $P_2$ is necessary for the calculation of the center position 22 shown in FIG. 5, the problem returns in a vicious circle, so that resolution is difficult.

Thus, the pattern obtained by a polar coordinate conversion varies greatly according to the placement of the origin of the polar coordinate conversion, and the precision of angle detection is influenced by this. Furthermore, as described above, in cases where the positioning pattern that is the object of comparison is disposed at an inclination, the inclination-angle cannot be determined with satisfactory precision even if the position determined by ordinary pattern matching is used "as is" as the origin of the polar coordinate conversion.

Next, a case in which a rotation-resistant reference point is taken as the origin of the polar coordinate conversion will be described. In order to facilitate comparison, the positioning patterns used are the same as those shown in FIGS. 6 and 7. In this case, since the positioning patterns are square, the rotation-resistant reference point is the center point of the square positioning pattern regardless of which of the two embodiments described in Japanese Patent Application Laid-Open (Kokai) No. 2002-208010 is used. Furthermore, even if the positioning patterns have an asymmetrical shape, results that are similar to those described below are obtained if the rotation-resistant reference point is determined according to the two embodiments of Japanese Patent Application Laid-Open (Kokai) No. 2002-208010, and this point is taken as the origin of the polar coordinate conversion.

Figure 8A:
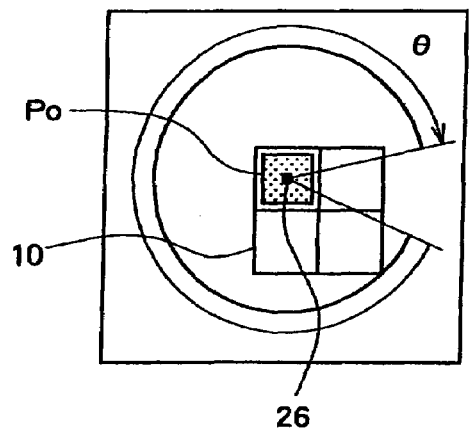
FIGS. 8A and 8B show how the polar coordinate conversion of the reference-image is performed based upon the principle of the present invention.
Figure 8B:
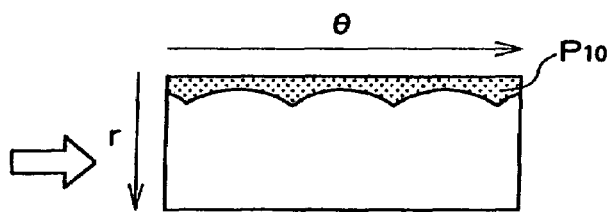
Figure 9A:
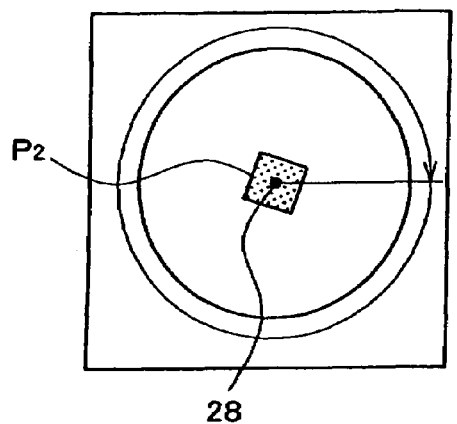
FIGS. 9A and 9B show how the polar coordinate conversion of the object-image is performed based upon the principle of the present invention.
Figure 9B:
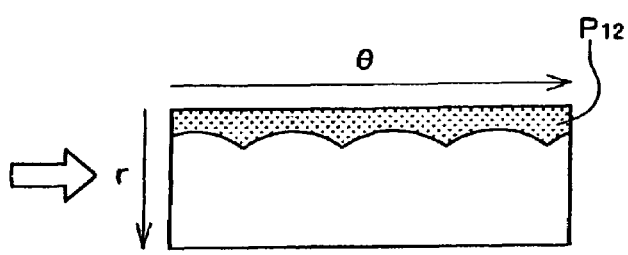

FIGS. 8 and 9 show the conditions of a polar coordinate conversion performed for the positioning patterns $P_0$ and $P_2$ with this rotation-resistant reference point set as the origin 26. FIGS. 8A and 9A show the positioning patterns $P_0$ and $P_2$ prior to the polar coordinate conversion, and FIGS. 8B and 9B show the positioning patterns $P_{10}$ an $P_{12}$ following the polar coordinate conversion, using the axis in the direction of the radius r and the axis in the direction of the angle θ. FIGS. 8A and 8B show the conditions of the polar coordinate conversion of the positioning pattern $P_0$ of the reference-image 10, and FIGS. 9A and 9B show the conditions of the polar coordinate conversion of the positioning pattern $P_2$ that is disposed at an inclination. The origins 26 and 28 of these polar coordinate conversions are both the centers of the square shapes of the positioning patterns $P_0$ and $P_2$ as described above.

Figure 10:
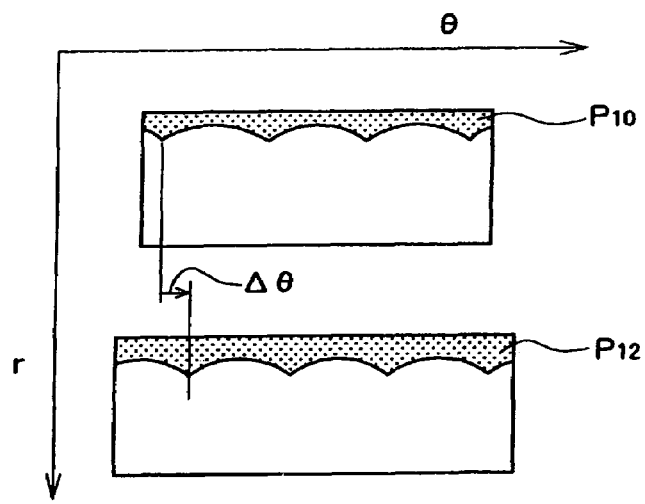
FIG. 10 shows how the inclination-angle $\Delta\theta$ is determined based upon the principle of the present invention.

FIG. 10 shows the image that is thus obtained following the polar coordinate conversion performed on the reference-image 10 as described above and the image that is obtained following the polar coordinate conversion performed on the image that is the object of comparison, arranged on the same angular axis. Thus, the positioning patterns $P_{10}$ and $P_{12}$ following the polar coordinate conversion have shapes that are relatively easy to compare. The deviation Δθ in the direction of the angular axis is determined from this comparison, and this is the inclination-angle of the positioning pattern $P_2$ with respect to the positioning pattern $P_0$.

Furthermore, polar coordinate conversion for the object of comparison is performed over 360°. However, as seen from FIG. 10, it is not always necessary to perform this conversion over 360° for the reference-image 10 if a polar coordinate conversion can be performed for a sufficiently large angular range with respect to the inclination-angle Δθ. For example, in a case where it is attempted to detect the inclination-angle within $Δθ_0$, a polar coordinate conversion can be performed in an angular range of $(360°-2Δθ_0)$. Furthermore, the radius r of the polar coordinate conversion can be set arbitrarily. However, if this radius is set at a value that is too small, the amount of information from the positioning patterns $P_0$ and $P_2$ is reduced, and there may be cases in which this has an effect on the detection precision of the inclination-angle. Preferably, this radius is set at the smallest radius that can accommodate all of the positioning patterns $P_0$ and $P_2$. By thus keeping the angular range and radius of the polar coordinate conversion at minimum values, it is possible to shorten the processing time of the pattern matching performed for the image following the polar coordinate conversion.

As described above, it was found that the inclination-angle can be detected with good precision while reducing the amount of calculation required by taking a rotation-resistant reference point as the origin of the polar coordinate conversion. The bonding pattern discrimination of the present invention was devised based upon this result.

The present invention will be described in detail below with reference to the accompanying drawings. Below, the present invention will be described using a wire bonding apparatus that bonds wires to common semiconductor chips. However, the wire bonding apparatus used may also be a wire bonding apparatus that is used for stacked ICs in which chips have other chips stacked on top. In the following description, furthermore, dedicated positioning patterns disposed on the surfaces of the chips are used as the positioning patterns utilized in bonding. However, bonding pads disposed on the diagonal lines of the chips may also be used as positioning patterns.

Embodiment 1

Figure 11:
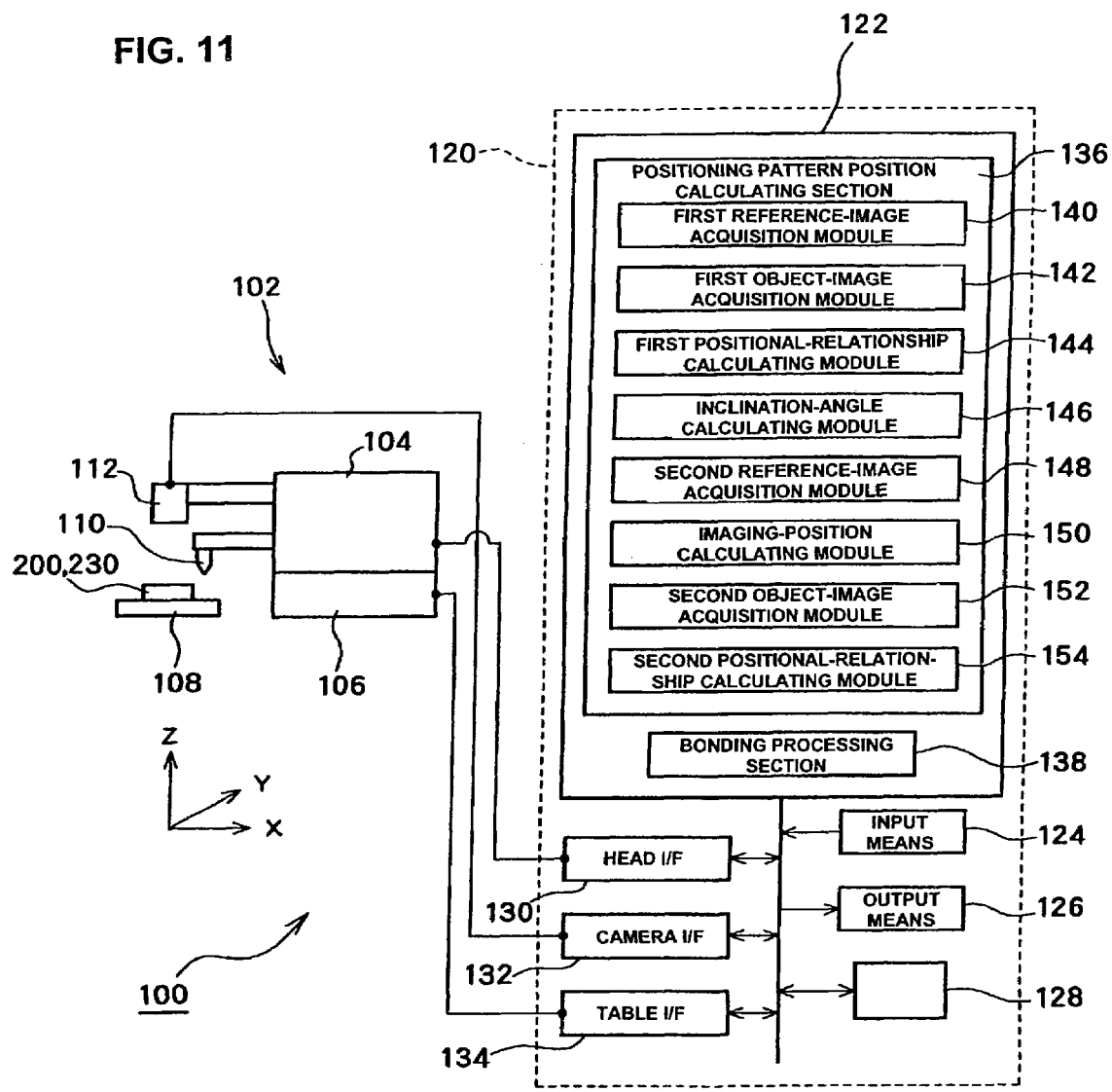
FIG. 11 is a block diagram of the wire bonding apparatus in an embodiment of the present invention.

FIG. 11 is a block diagram of a wire bonding apparatus 100 using the bonding pattern discrimination method of the present invention. Furthermore, a reference chip 200 or bonding object chip 230 used to discriminate the positioning pattern is also shown, although this is not a constituent element of the wire bonding apparatus 100.

The wire bonding apparatus 100 comprises an apparatus main body 102 and a control section 120. The apparatus main body includes a bonding head 104, a table 106 which moves the bonding head 104 within the XY plane shown in FIG. 8, and a stage 108 that holds the chips 200, 230. A tool 110 which bonds a wire to the chips, and a camera 112 which detects the positions of the chips 200, 230, are attached to the bonding head 104. The bonding head 104 is connected to the bonding head I/F 130 of the control section 120 by a signal line. Similarly, the camera 112 is connected to the camera I/F 132, and the table 106 is connected to the table I/F 134, via respective signal lines.

The control section 120 has the function of controlling the overall operation of the elements that constitute the apparatus main body 102. In particular, this control section 120 has the functions of calculating the positions of the positioning patterns, and performing wire bonding based upon the results of this calculation. Such a control section 120 can be constructed from a general computer, or a computer that is especially meant for use in a bonding apparatus.

The control section 120 includes a CPU 122, an input means 124 such as a keyboard or input switch, etc., an output means 126 such as a display, etc., a memory 128 which stores image data, etc., and the above-described bonding head I/F 130, camera I/F 132 and table I/F 134; and these elements are connected to each other by an internal bus.

The CPU 122 includes a positioning pattern position calculating section 136 which has the function of performing processing that calculates the positions of the positioning patterns, and a bonding processing section 138 which has the function of setting the wire bonding conditions and performing wire bonding processing based upon the calculated positions of the positioning patterns. Software can be used to perform such processing; specified processing can be performed by executing corresponding bonding pattern discrimination programs and bonding programs. Furthermore, some of the processing may also be performed by hardware.

Figure 12:
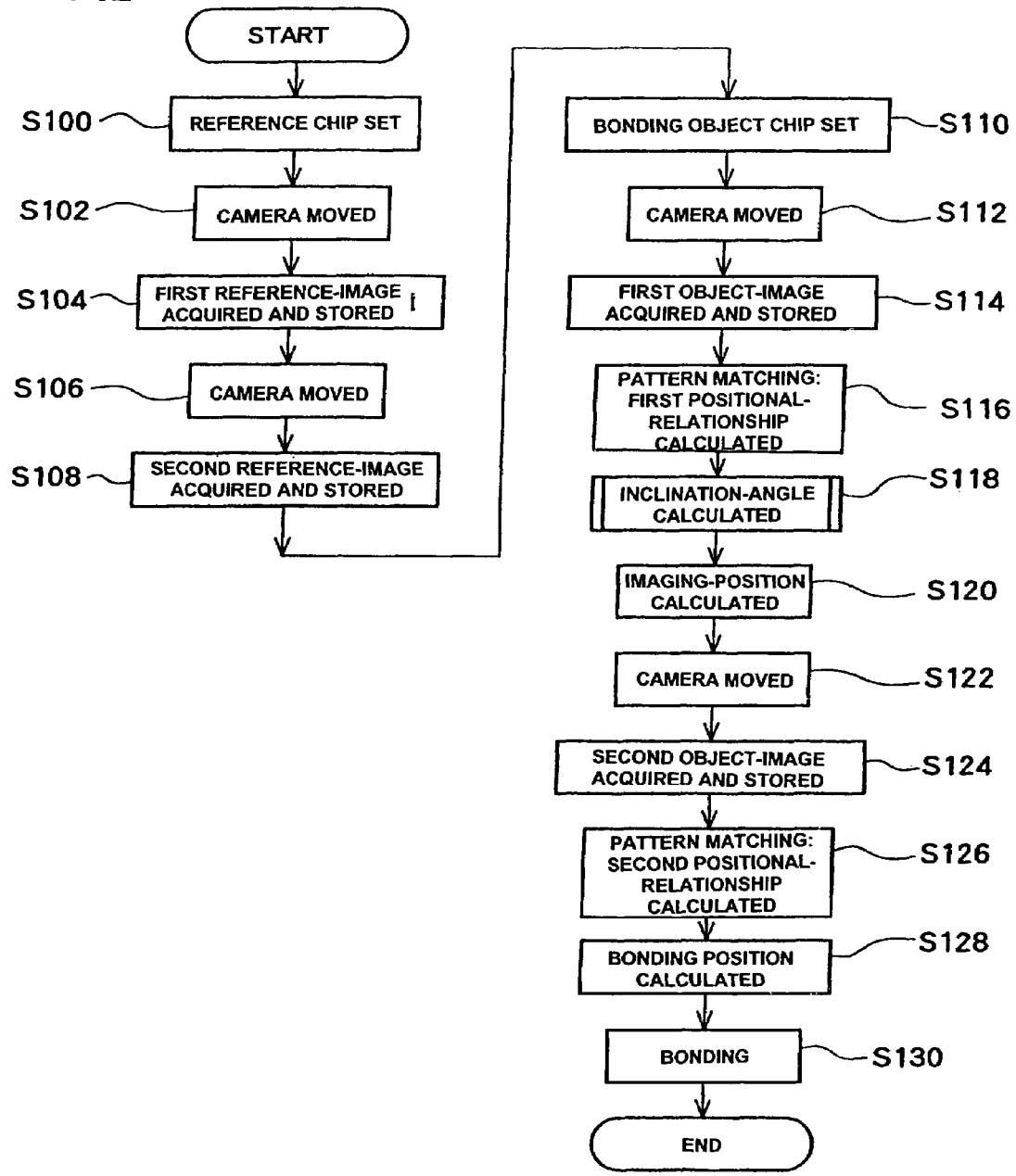
FIG. 12 is a flow chart showing the procedure of the calculation of the positions of the positioning patterns in an embodiment of the present invention.

Details of the functions from the first reference-image acquisition module 140 to the second positional-relationship calculating module 154 of the positioning pattern position calculating section 136, and the function of the bonding processing section 138, will be described with reference to the flow chart shown in FIG. 12. Symbols corresponding to the symbols shown in FIGS. 3 and 11 will be used.

First, the reference chip 200 is set (S100). More specifically, a chip used as a reference for the discrimination of the inclination of positioning pattern is set as the reference chip 200, and this chip is held on the stage 108. Next, the camera 112 is moved, and is brought to a position in which the imaging field can capture the first positioning pattern 202 of the reference chip 200 (S102).

Then, an image including the first positioning pattern 202 is acquired, and this image is stored in memory as the first reference-image (S104). More specifically, the first reference-image acquisition module 140 sends instructions to the camera 112 via the camera I/F 132, the first positioning pattern 202 of the reference chip 200 is imaged, and this data is stored in the memory 128. The acquired image corresponds to the first reference-image 204 shown in FIG. 3. The camera 112 is provided with a function that superimposes crosshairs on the image in order to indicate a reference for the imaging range; the intersection point of these crosshairs is the center position 206 of the imaging range. This position is used as the position of the first positioning pattern 202. The coordinates of the center position 206 correspond to $(X_1, Y_1)$ shown in FIG. 3.

Next, the camera 112 is moved, and is brought to a position where the imaging visual field can capture the second positioning pattern 212 of the reference chip 200 (S106).

Then, an image including the second positioning pattern 212 is acquired, and this image is stored in memory as the second reference-image (S108). More specifically, the second reference-image acquisition module 148 sends instructions to the camera 112 via the camera I/F 132, the second positioning pattern 212 of the reference chip 200 is imaged, and this data is stored in the memory 128. The acquired image corresponds to the second reference-image 214 in FIG. 3. The center position 216 of the imaging range in this case is used as the position of the second positioning pattern 212. The coordinates of the center position 216 correspond to $(X_2, Y_2)$ shown in FIG. 3.

The steps up to this point are a training process that uses the reference chip 200; and running steps that use the bonding object chip 230 are performed next.

In the running steps, the bonding object chip 230 is first set (S110). Specifically, the reference chip 200 is removed from the stage 108, and the chip 230 that is the object of bonding work is set on the stage 108. Then, the camera 112 is moved (S112), imaging is performed in the same visual field position as that in which the first reference-image 204 was imaged, and this image is stored in the memory 128 as the first object-image (S114). More specifically, the first object-image acquisition module 142 sends instructions to the camera 112 via the camera I/F 132, the first positioning pattern 232 of the bonding object chip 230 is imaged, and this data is stored in the memory 128. The acquired first object-image corresponds to an image of the imaging field 220 including the bonding object chip 230 in FIG. 3.

Next, pattern matching is performed between the first reference-image 204 and first object-image, and a first positional-relationship which is the relative positional-relationship between the first positioning pattern 202 of the reference chip 200 and the first positioning pattern 232 of the bonding object chip 230 is calculated (S116). More specifically, the first positional-relationship calculating module 144 reads out the first reference-image 204 and first object-image from the memory 128, disposes the first object-image and first reference-image with the origins of the imaging visual fields aligned, and moves both images parallel to each other so that the overlapping of the first positioning pattern of the first reference-image and the first positioning pattern of the first object-image shows a maximum value. For example, normalized correlation calculations can be used as pattern matching method. As a result of this pattern matching, the center position of the first reference-image moves from the original center position 206 to the center position 236; this moved position is determined. This moved position indicates the relative position of the first positioning pattern 232 of the first object-image with reference to the center position 206 of the first reference-image 204. The position of the first positioning pattern 232 of the first object-image obtained as a result of pattern matching corresponds to the coordinates $(X_3, Y_3)$ shown in FIG. 3.

Figure 13:
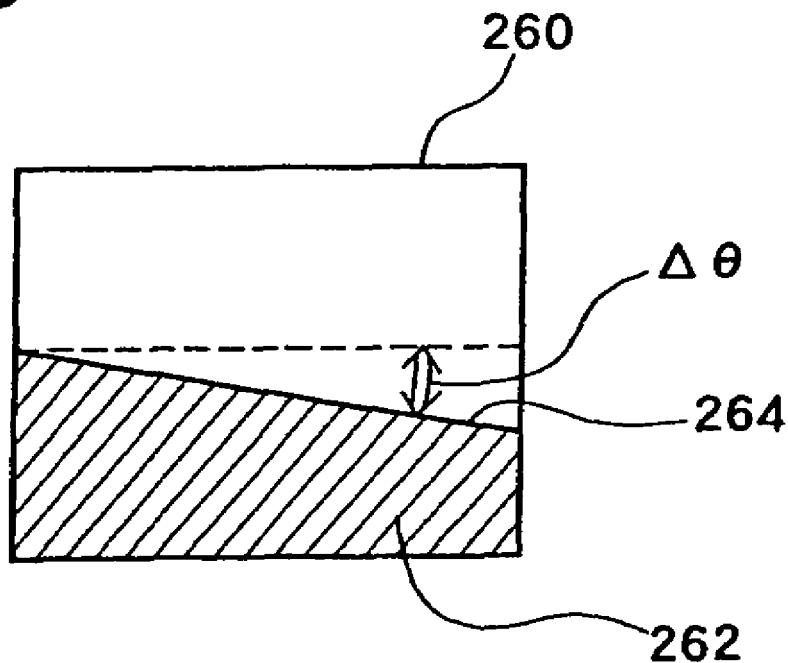
FIG. 13 illustrates one example of inclination-angle detection.

Next, using the first positioning pattern 202 of the first reference-image 204 as a reference, the inclination-angle of the first positioning pattern 232 of the first object-image is calculated (S118). The calculation of this inclination-angle can be accomplished using a conventional technique. For example, FIG. 13 shows how inclination-angle detection is accomplished using the edge detection method. In FIG. 13, when a pattern 262 such as a positioning pattern, etc., is obtained in the imaging field 260, the angle $\Delta\theta$ formed by this pattern with respect to the reference axis can be determined by detecting the edge 264. Furthermore, an embodiment that further increases the detection precision of the inclination-angle will be described later in Embodiments 2 through 4. The calculated inclination-angle corresponds to $\Delta\theta$ shown in FIG. 3.

The next imaging-position is calculated based upon the calculated inclination-angle $\Delta\theta$ and the coordinates $(X_1, Y_1)$, $(X_2, Y_2)$ and $(X_3, Y_3)$ (S120). More specifically, the imaging-position calculating module 150 performs the calculations of the above-described Equations (5) through (9) using the above-described data, thus calculating the coordinates $(X_4, Y_4)$, and these coordinates are taken as the center position of the next imaging-position. The calculation results correspond to the imaging range 250 shown in FIG. 3.

If the respective coordinates and inclination-angles $\Delta\theta$ are calculated without error, the center position of the imaging range 250 in FIG. 3 should coincide with the position of the second positioning pattern 252 of the bonding object chip 230. In actuality, however, error occurs in the respective measurements and respective calculations; accordingly, the position of the second positioning pattern 252 of the bonding object chip 230 is next determined by pattern matching. Specifically, the camera is moved to the calculated imaging-position (S122), the second positioning pattern 252 of the bonding object chip 230 is imaged in this position, and this image is stored in the memory 128 as the second object-image (S124). More specifically, the second object-image acquisition module 152 sends instructions to the camera 112 via the camera I/F 132, so that the second positioning pattern 252 of the bonding object chip 230 is imaged, and this data is stored in the memory 128. The acquired second object-image corresponds to the imaging rang 250 including the bonding object chip 230 in FIG. 3.

Next, pattern matching is performed between the second reference-image 214 and second object-image, so that a second positional-relationship which is the relative positional-relationship between the second positioning pattern 212 of the reference chip 200 and the second positioning pattern 252 of the bonding object chip 230 is calculated (S126). More specifically, the second positional-relationship calculating module 154 reads out the second reference-image 214 and second object-image from the memory 128, and performs pattern matching by the same method as that described for the first positional-relationship calculation step (S116). The position of the second positioning pattern 252 of the second object-image that is obtained as a result of pattern matching corresponds to the point 256 in FIG. 3.

Thus, by detecting the inclination-angle Δθ and calculating Equations (5) through (9), it is possible to move the camera at a high speed to the next imaging-position, and to obtain the position of the second positioning pattern for the bonding object chip 230. Once the positions of the first positioning pattern and second positioning pattern have thus been determined in the running steps, the processing required for wire bonding is performed by the function of the bonding processing section 138. For example, the positions of the respective bonding pads of the bonding object chip are calculated based upon the positions of the first positioning pattern and second positioning pattern (S128). Then, an instruction to move the tool 110 to the corrected bonding pad positions is sent to the table 106 via the table I/F 134, and when the tool 110 is moved to these positions, instructions are sent to the bonding head 104 via the bonding head I/F 130 so that the operations of the tool that are required for wire bonding are performed, thus resulting in the performance of wire bonding (S130).

Embodiment 2

Figure 14:
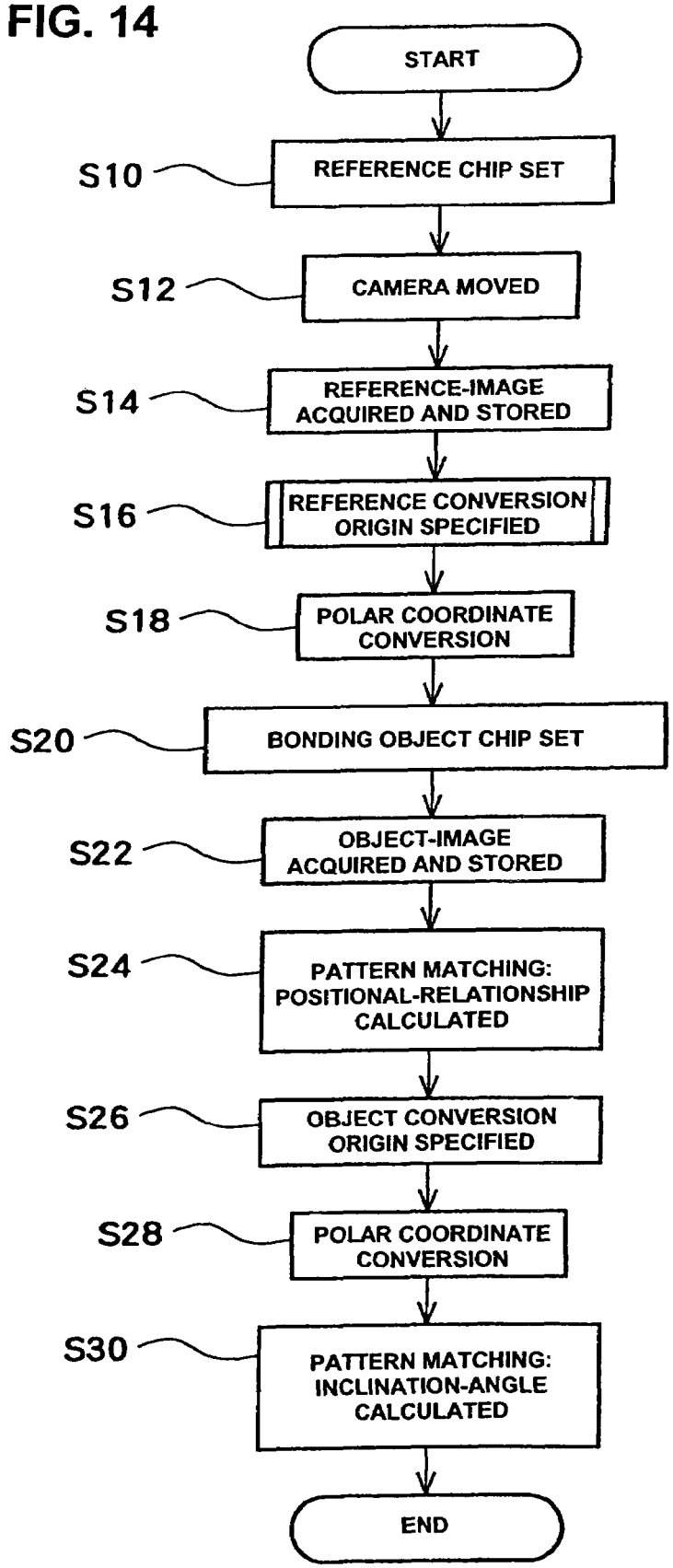
FIG. 14 is a detailed internal flow chart of the inclination-angle detection in Embodiment 2.

An embodiment in which a polar coordinate conversion is used as the method of detecting the inclination-angle of the positioning patterns will be described with reference to the flow chart shown in FIG. 14. The flow chart shown in FIG. 14 summarizes the procedure used to determine the inclination-angles of the positioning patterns separately from the flow chart shown in FIG. 12. Accordingly, when this flow chart is combined with the flow chart shown in FIG. 12, it is necessary to omit the duplicated steps. Furthermore, in the flow chart shown in FIG. 12, the designations "first" and "second" are used in order to distinguish the two positioning patterns. However, since the following description relates to the procedure used to determine the inclination-angle for a single positioning pattern, the designation of "first" is omitted, and the patterns are referred to simply as the "reference pattern" and "positioning pattern".

Furthermore, since it is convenient to use the description in FIGS. 4 through 10 to describe the principle of the polar coordinate conversion, patterns with a rectangular shape such as bonding pads will be described below as the positioning patterns. In regard to the conditions of the images corresponding to the respective steps, corresponding conditions in FIGS. 4 through 10 will be indicated when necessary. Furthermore, the symbols used are the symbols of FIG. 11. Furthermore, the contents described below are executed as functions of internal modules of the CPU 122.

First, the reference chip 200 is set (S10). More specifically, a chip that acts as a reference for the discrimination of the inclination of the positioning patterns is used as a reference chip 200, and this chip is held on the state 108. Next, the camera 112 is moved, and is brought to a position which is such that the imaging visual field can capture the positioning pattern $P_0$ of the reference chip 200 (S12).

Figure 1:
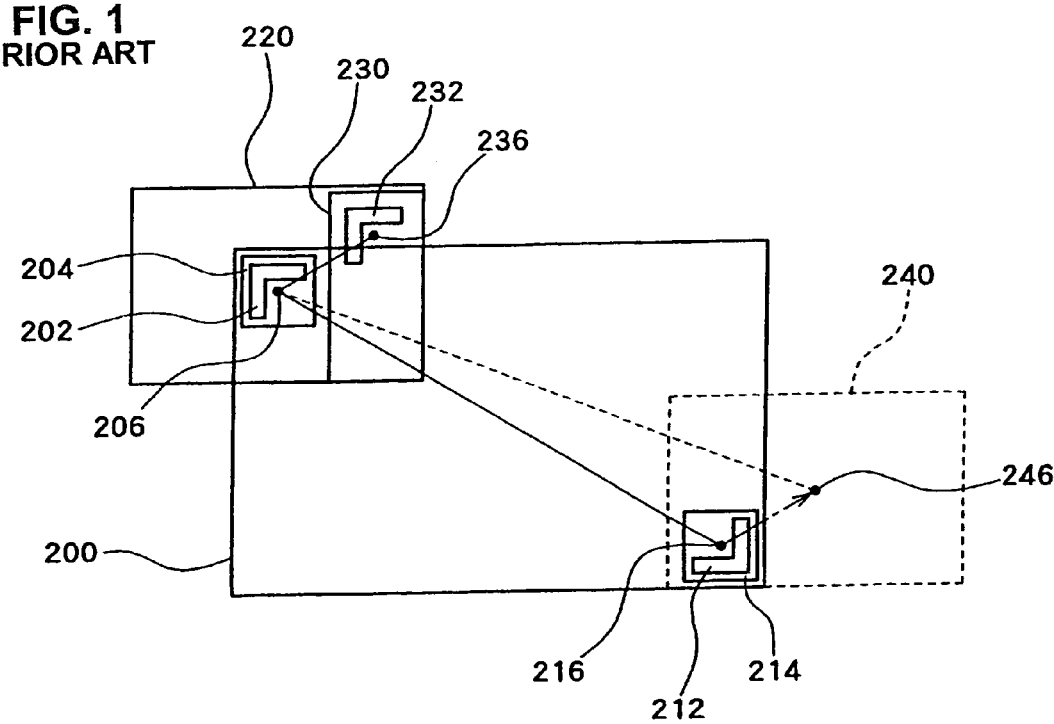
FIG. 1 shows how the positioning patterns are disposed in a case where the bonding object chip is not inclined with respect to the reference chip in the related art.

Then, an image including the positioning pattern $P_0$ is acquired, and this image is stored in memory as a reference-image (S14). More specifically, the CPU 122 sends instructions to the camera 112 via the camera I/F 132 so that the positioning pattern $P_0$ of the reference chip 200 is imaged, and this data is stored in the memory 128. The acquired image corresponds to the reference-image 10 in FIG. 1. The camera 112 is provided with a function that superimposes cross-hairs on the image in order to indicate the reference of the imaging range, and the intersection point of these cross-hairs is the center position 20 of the imaging range. In subsequent processing relating to the image, these cross-hairs are used as reference coordinate axes, and the center position 20 constituting the intersection point is used as the coordinate origin.

Next, the reference conversion origin which is the origin used for the polar coordinate conversion is specified for this reference-image 10 (S16). More specifically, the CPU 122 calculates the rotation-resistant reference point described in the "Principle of Improvement of Precision of Inclination-angle" of the present invention based upon the data of the reference-image 10 stored in the memory 128, and specifies these coordinates as the reference conversion origin. Furthermore, as described above, the coordinates of the reference conversion origin are specified using the center position 20 as a reference. The more detailed content of this process will be described later in Embodiment 2 and Embodiment 3. The specified reference conversion origin corresponds to the origin 26 in FIG. 8.

The reference-image 10 is subjected to a polar coordinate conversion using the specified reference conversion origin (S18), and the resulting image is stored in the memory 128 as a post-conversion reference-image. More specifically, the CPU 122 reads out the reference-image 10 from the memory 128, determines the coordinates of the specified reference conversion origin using the center position 20 as a reference, and takes this origin as the origin of the polar coordinate conversion. Then, for example, calculations are performed in which the image is varied by an angle of θ in the clockwise direction, and the brightness data of the reference-image are converted as a function of the radius r for each angle θ. Accordingly, in the reference-image following this conversion, the brightness data are disposed with the horizontal axis taken as the angle θ, and the vertical axis taken as the radius r. Such a post-conversion reference-image corresponds to the image shown in FIG. 8B.

The process up to this point is a training process that uses the reference chip 200; next, a running process that uses the bonding object chip 230 is performed.

In the running process, the bonding object chip 230 is first set (S20). Specifically, the reference chip 200 is removed from the stage 108, and the chip 230 that is the object of bonding work is set on the stage 108. Then, imaging is performed in the same visual field position as that in which the reference-image 10 was acquired, and the resulting image is stored in the memory 128 as an object-image (S22). More specifically, the CPU 122 sends instructions to the camera 112 via the camera I/F 132 so that the positioning pattern $P_2$ of the bonding object chip 230 is imaged, and this data is stored in the memory 128. The acquired object-image corresponds to FIG. 5A.

Next, pattern matching is performed between the reference-image 10 and the object-image, and the relative positional-relationship between the positioning pattern $P_0$ of the reference chip 200 and the positioning pattern $P_2$ of the bonding object chip is calculated (S24). More specifically, the CPU 122 reads out the reference-image 10 and object-image from the memory 128, disposes the object-image and reference-image with the origins of the imaging visual fields aligned, and moves both images parallel to each other so that the overlapping of the positioning pattern of the reference-image and the positioning pattern of the object-image shows a maximum value. For example, normalized correlation calculations can be used as pattern matching method. As a result of this pattern matching, the center position of the reference-image moves from the original center position 20 to the center position 24; the amount of this movement ($\Delta X$, $\Delta Y$) is determined. This movement amount ($\Delta X$, $\Delta Y$) indicates the relative position of the positioning pattern of the object-image with reference to the center position 20 of the reference-image 10. The conditions of this pattern matching correspond to FIG. 5B.

Next, the object conversion origin which is the origin that is used in order to subject the object-image to a polar coordinate conversion is specified (S26). More specifically, the CPU 122 performs the following calculations. Specifically, if the coordinates of the reference conversion origin 26 with reference to the center position 20 are designated as $(X_{26}, Y_{26})$, and the coordinates of the object conversion origin are designated as $(X_{28}, Y_{28})$, then the coordinates of this origin are $(X_{28}=X_{26}+\Delta X, Y_{28}=Y_{26}+\Delta Y)$. The object conversion origin corresponds to the origin 28 in FIG. 9A.

The object-image is subjected to a polar coordinate conversion using the object conversion origin thus specified (S28), and the resulting image is stored in the memory as a post-conversion object-image. More specifically, the CPU 122 reads out the object-image from the memory 128, determines the coordinates of the specified reference conversion origin, takes these coordinates as the origin of the polar coordinate conversion, and performs calculations in which, for example, the image is varied by an angle of $\theta$ in the clockwise direction, and the brightness data of the reference-image is converted as a function of the radius r for each angle $\theta$. Such a post-conversion reference-image corresponds to the image shown in FIG. 9B.

Pattern matching is performed for the post-conversion reference-image and post-conversion object-image thus determined, and the inclination-angle is calculated (S30). More specifically, the CPU 122 reads out the post-conversion reference-image and post-conversion object-image from the memory 128, disposes both images with the origins of the angular axes aligned, moves both images parallel to each other along the angular axis, and determines the movement amount $\Delta\theta$ which is such that the overlapping of the positioning pattern of the post-conversion reference-image and the positioning pattern of the post-conversion object-image shows a maximum value. This movement amount $\Delta\theta$ indicates the relative inclination-angle of the positioning pattern $P_2$ of the bonding object chip 230 with reference to the positioning pattern $P_0$ of the reference chip 200. The conditions of the determination of the inclination-angle $\Delta\theta$ are shown in FIG. 10.

Thus, the inclination-angles of the positioning patterns can be determined with good precision by calculating the rotation-resistant reference point described in the "Principle of Improvement of Precision of Inclination-angle" of the present invention, specifying the coordinates of this point as the reference conversion origin, and performing a polar coordinate conversion using this origin.

Accordingly, the imaging-position in which the next positioning pattern is imaged can be determined with a higher degree of precision, so that the next positioning pattern can be captured more securely even if the imaging range is narrowed. An example of this is indicated by the narrower imaging range 270 shown in FIG. 3. By making the imaging range narrower, it is possible to reduce the amount of processing required for pattern matching in this region, and to shorten the processing time.

Embodiment 3

Figure 15:
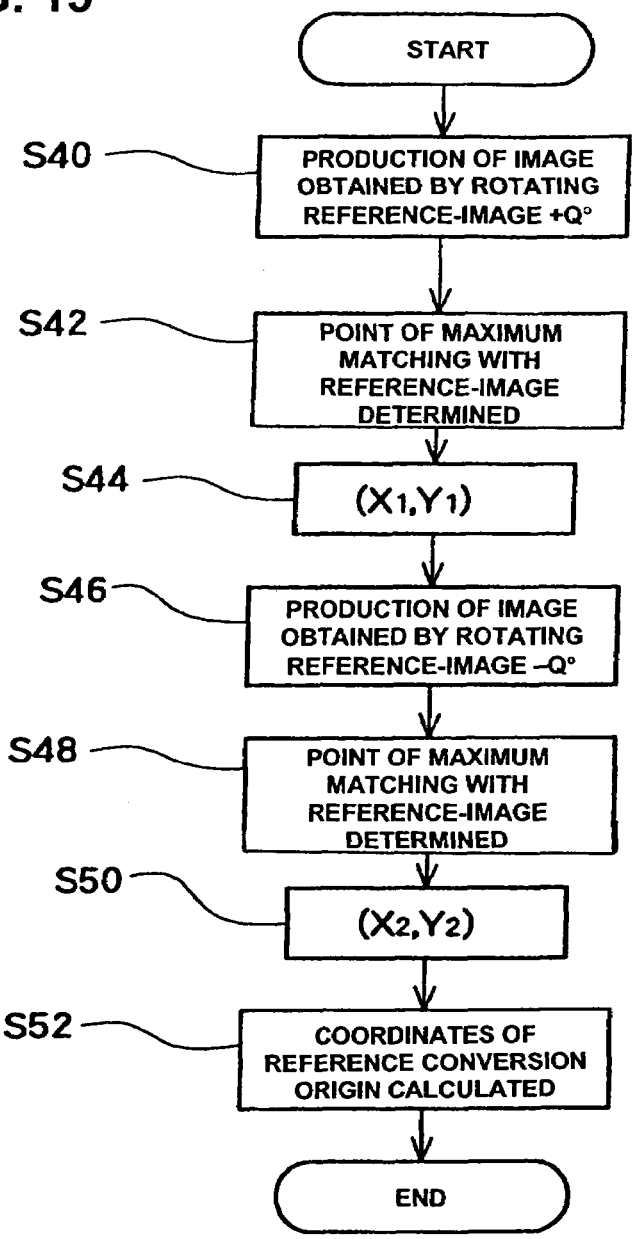
FIG. 15 is a detailed internal flow chart of the reference conversion origin specifying step in Embodiment 3.

The more detailed content of the reference conversion origin specifying step (S16) will be described. Embodiment 3 corresponds to an embodiment in which the first embodiment in the above-described Japanese Patent Application Laid-Open (Kokai) No. 2002-208010 is applied to the bonding positioning patterns. The detailed content of this reference conversion origin specifying step will be described with reference to the internal flow chart shown in FIG. 15, and FIGS. 16 through 21. In FIG. 15, and FIGS. 16 through 21, elements that are the same as elements shown in FIGS. 4 and 5 are labeled with the same symbols, and a detailed description of such elements is omitted. Furthermore, the procedure shown in the internal flow chart in FIG. 15 is performed by internal modules in the CPU 122 illustrated in FIG. 11.

The reference-image 10 acquired by the steps S10 through S14 illustrated in FIG. 14 is used to specify the reference conversion origin. FIG. 16 is a diagram which again shows the relationship between the positioning pattern $P_0$ and the external shape of the reference chip 200 for the reference-image 10. FIG. 14 is similar to FIG. 4. However, it is indicated that the positioning pattern $P_0$ uses square bonding patterns that are disposed in the vicinity of the corners of the reference chip 200. Furthermore, the range of the reference-image 10 is set on the inside of the outer shape line of the reference chip 200 so that noise from this outer shape line cannot enter. In order to indicate that there is no objection to the disposition of the positioning pattern $P_0$ intersecting with the crosshairs, the disposition of the positioning pattern is slightly different than that shown in FIG. 4. In the subsequent processing, the crosshairs of the reference-image 10 are taken as the reference coordinate axes, and the center position 20 constituting the intersection point of the crosshairs is taken as the origin of the reference axes.

Figure 17:
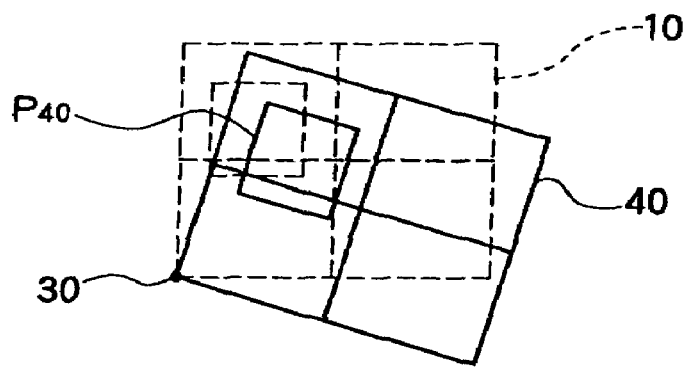
FIG. 17 is a diagram showing the conditions of the rotated image that is obtained by rotating the reference-image $+Q°$ about the lower left corner point in the reference-image in Embodiment 3.

Using this reference-image 10, a rotated image obtained by rotating the image $+Q°$ about one corner of the reference-image 10 is produced (S40). FIG. 17 shows the conditions of the rotated image 40 centered on the point 30 at the lower left corner in the reference-image 10.

Figure 18:
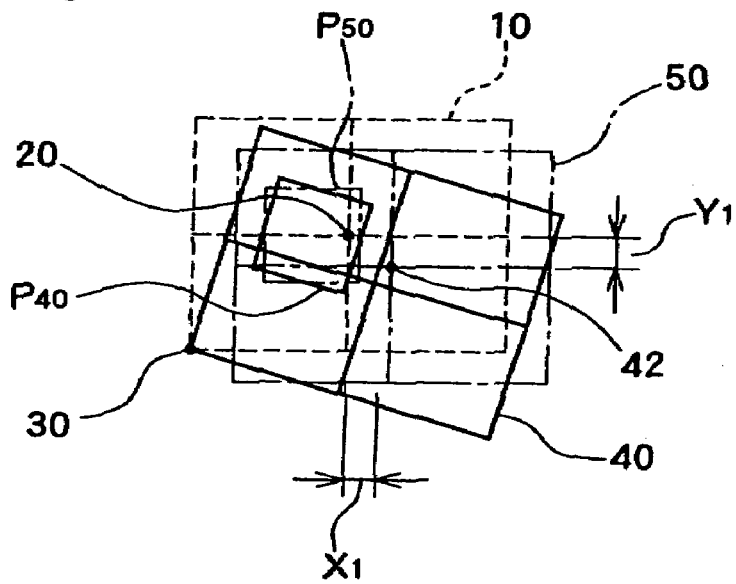
FIG. 18 is a diagram showing the conditions of pattern matching between the reference-image and the rotated image obtained by rotating the reference-image $+Q°$ in Embodiment 3.

Next, the point of best matching is determined by pattern matching between the reference-image 10 and the rotated image 40 (S42). More specifically, the reference-image 10 is moved parallel to the rotated image 40 so that maximum overlapping is obtained between the positioning pattern of the reference-image 10 and the positioning pattern of the rotated image 40. The center position in the reference-image 50 in the case of maximum overlapping is the point of best matching 42 of both images. The conditions of this matching are shown in FIG. 18. The coordinates of the original center position 20 of the reference-image 10 are designated as (0, 0), and the coordinates of the point of best matching 42 are designated as $(X_1, Y_1)$ (S44).

Figure 19:
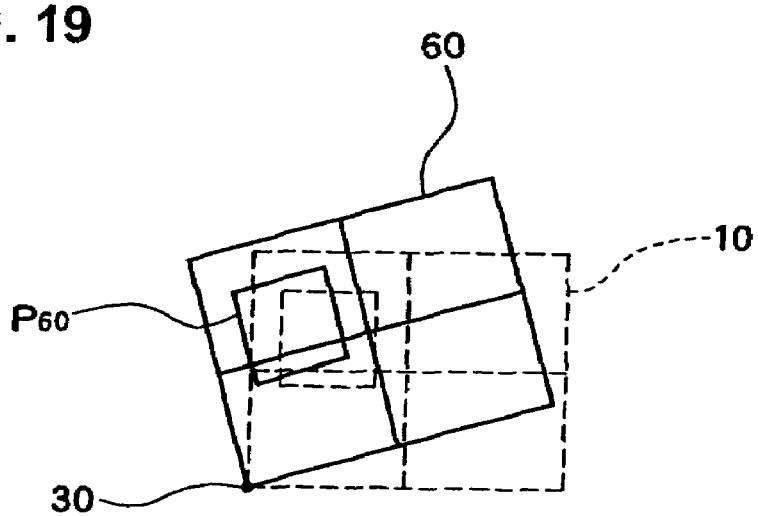
FIG. 19 is a diagram showing the conditions of the rotated image that is obtained by rotating the reference-image $-Q°$ about the lower left corner point in the reference-image in Embodiment 3.
Figure 20:
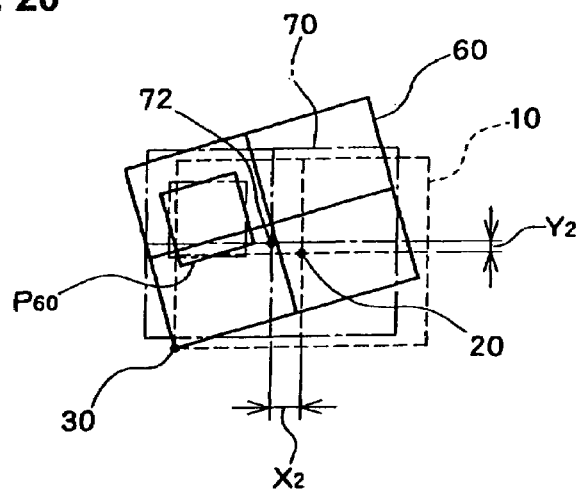
FIG. 20 is a diagram showing the conditions of pattern matching between the reference-image and the rotated image obtained by rotating the reference-image $-Q°$ in Embodiment 3.

Similarly, as shown in FIG. 19, a rotated image 60 that is rotated $-Q°$ about the corner point 30 of the reference-image 10 is produced (S46). Then, the point of best matching of both images is determined by pattern matching between the reference-image 10 and rotated image 60 (S48). More specifically, as shown in FIG. 20, the reference-image 10 is moved parallel to the rotated image 60 so that the positioning pattern of the reference-image 10 and the positioning pattern of the rotated image 60 show a maximum degree of overlapping. The center position of the reference-image 70 in the case of maximum overlapping is the point of best matching 72. The coordinates of the point of best matching 72 are designated as $(X_2, Y_2)$ (S50).

The coordinates of the reference conversion origin are calculated using the coordinates $(X_1, Y_1)$ of the point of best matching 42 thus determined, the coordinates $(X_2, Y_2)$ of the point of best matching 72, the rotational angle $Q°$, and the coordinates (XC1, YC1) of the corner point 30 taken as the center of rotation (S52). The coordinates (AX1, AY1) of the reference conversion origin are expressed by the Equations (1) through (4) as described above.

$$AX1 = XC1 + r \cdot \cos\alpha \tag{1}$$

$$AY1 = YC1 + r \cdot \sin\alpha \tag{2}$$

Here, $\alpha = \tan^{-1}\{(X_2-X_1)/(Y_1-Y_2)\}$ (3)

$r = \sqrt{\{(X_2-X_1)^2 + (Y_1-Y_2)^2\}}/2\sin Q$ (4)

Figure 21:
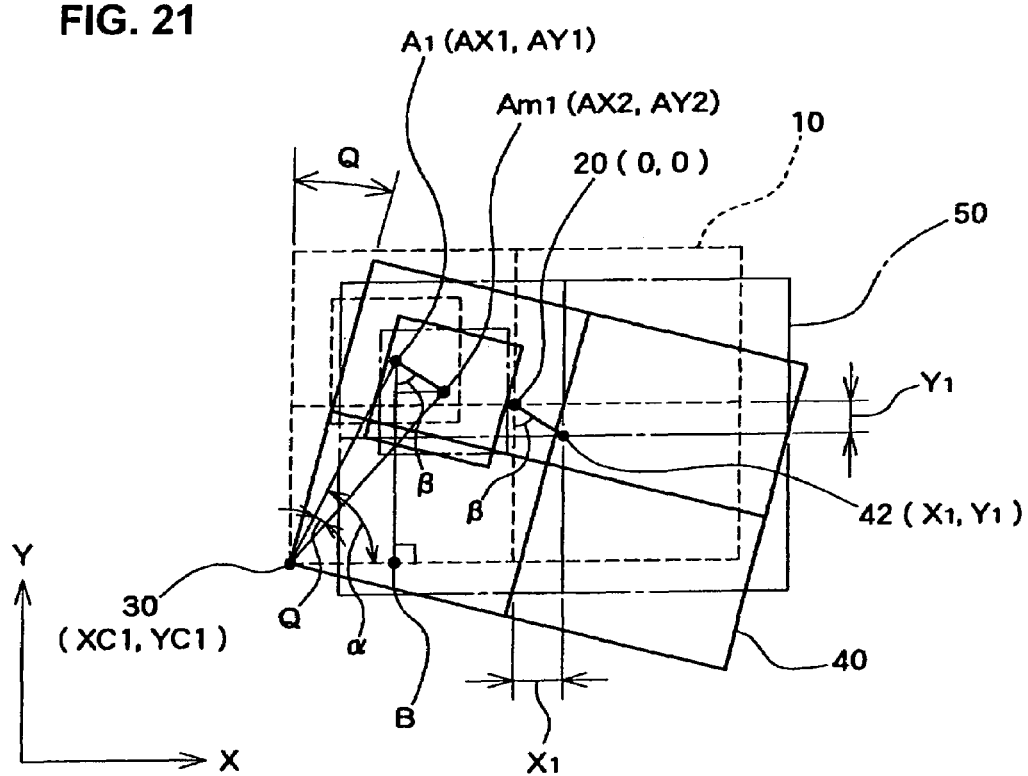
FIG. 21 is a diagram illustrating the content of the equation used to determine the reference conversion origin in Embodiment 3.

FIG. 21 enlarges FIG. 13 in order to illustrate the meaning of the Equations (1) through (4), and shows the corresponding coordinates and angles. Here, the point $A_1$ is the reference conversion origin for the reference-image 10, and the point $A_{m1}$ is the reference conversion origin for the reference-image 50. Since the pattern matching is performed by parallel movement of the reference-images, the accompanying movement of the reference conversion origin is the same as the movement of the center position of the reference-image. Specifically, the positional-relationship of the point $A_1$ and point $A_{m1}$ is the same as the positional-relationship of the center positions 20 and 42.

Figure 16:
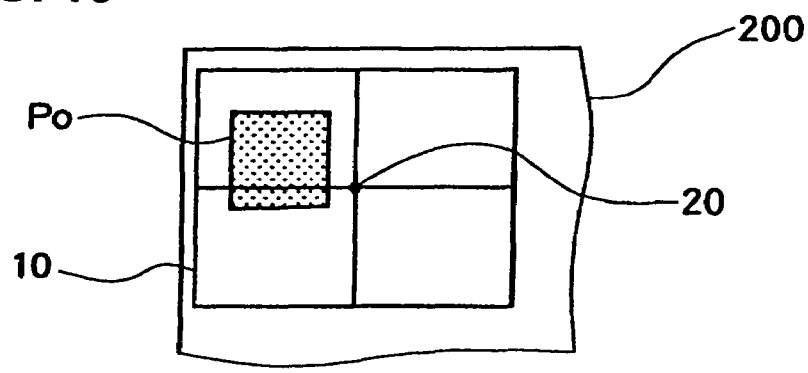
FIG. 16 is a diagram showing the relationship between the positioning patterns and the external shape of the reference chip for the reference-image.

Equation (3) can be explained utilizing the fact that the angle in FIG. 16 (point 30–point $A_1$–point $A_{m1}$) can be approximated by a right angle in cases where the angle Q is very small. Specifically, if the leg of a perpendicular line dropped to the X axis shown in FIG. 16 from the point $A_1$ is designated as point B, and the angle (point $A_{m1}$–point $A_1$–point B) is designated as β, then, from the above-described approximation, the angle (point 30–point $A_1$–point B)=90°=–β, and the other angle (pint $A_1$–point B–point 30)=90°. Accordingly, the angle (point $A_1$–point 30–point B)=α=β. Furthermore, since $\beta = \tan^{-1}(X_1/Y_1)$, $\alpha = \tan^{-1}(X_1/Y_1)$. Equation (3) is an equation in which this is rewritten as an equation using $(X_1, Y_1)$ and $(X_2, Y_2)$.

Equation (4) can be explained utilizing the fact that the distance between the tip ends of mutually equal line segments of a length r on both sides of the angle Q can be approximated by r×sinQ in cases where the rotational angle Q is very small. Specifically, the length of the line segment (point $A_1$–point $A_{m1}$)=r×SinQ=the length of (point 20–point 42)=$\sqrt{\{(X_1)^2+(Y_1)^2\}}$; accordingly, $r = \sqrt{\{(X_1)^2+(Y_1)^2\}}/\sin Q$ is obtained from this. Equation (4) is an equation in which this is rewritten as an equation using $(X_1, Y_1)$ and $(X_2, Y_2)$.

When r and α are thus determined from the coordinates $(X_1, Y_1)$ and $(X_2, Y_2)$ and the rotational angle Q, the coordinates (AX1, AY1) of the reference conversion origin in the reference-image 10 can be calculated specified by Equations (1) and (2) using the coordinates (XC1, YC1) of the point 30.

The method used to specify the reference conversion origin in Embodiment 2 can be used even if the positioning pattern is asymmetrical. Accordingly, the inclination-angle can be calculated with better precision, without being influenced by the shape of the positioning pattern.

Embodiment 4

Figure 22:
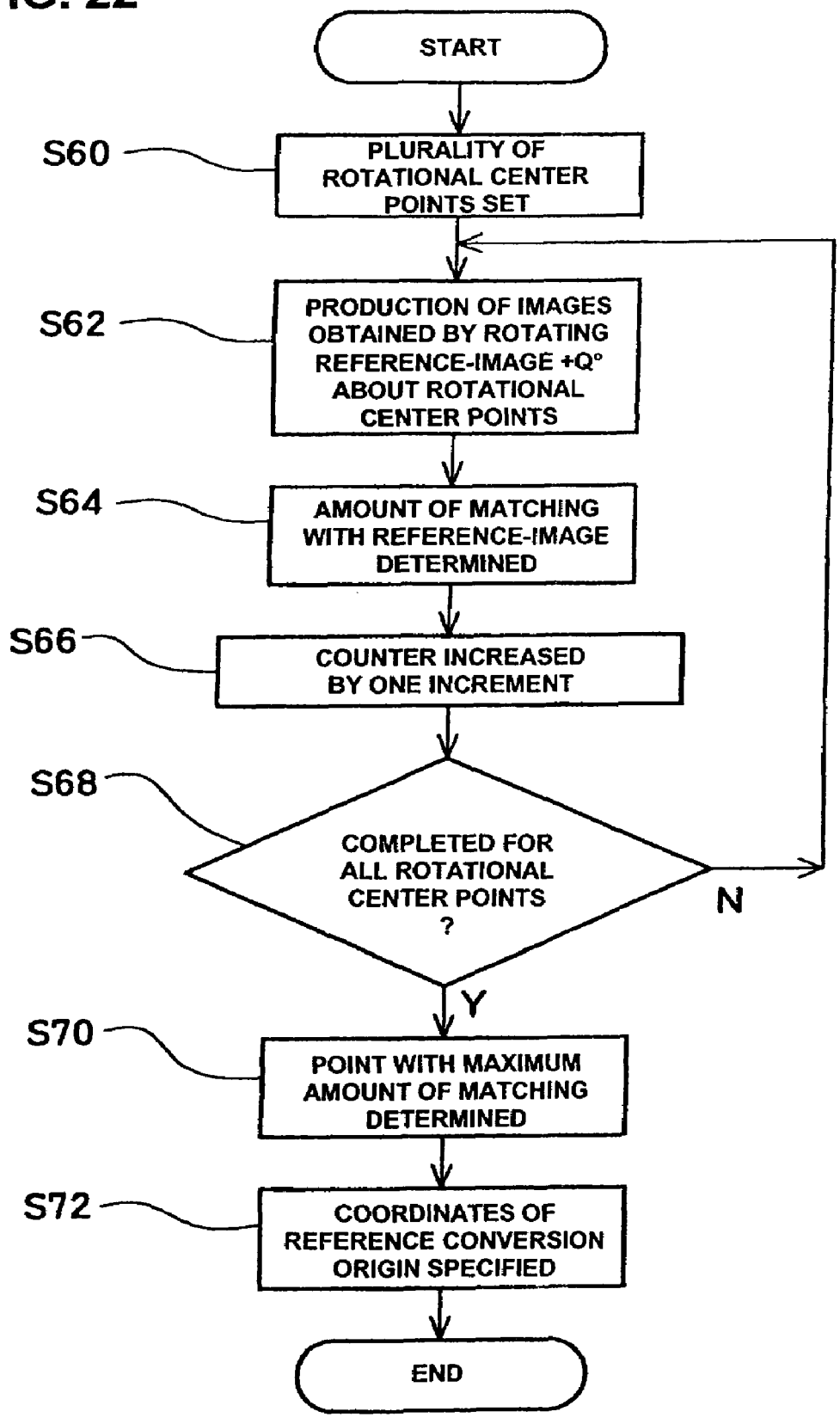
FIG. 22 is a detailed internal flow chart of the reference conversion origin specifying step in Embodiment 4.

Embodiment 4 corresponds to an embodiment in which the second embodiment in the above-described Japanese Patent Application Laid-Open (Kokai) No. 2002-208010 is applied to the bonding positioning pattern with regard to the reference conversion origin specification step. The detailed content of this reference conversion origin specification step will be described with reference to the internal flow chart shown in FIG. 22, and FIG. 23. The procedure of the internal flow chart shown in FIG. 22 is executed by internal modules in the CPU 122 illustrated in FIG. 11.

The reference-image 10 acquired in the steps S10 through S14 illustrated in FIG. 14 is also used for the specification of the reference conversion origin in Embodiment 4.

Figure 23:
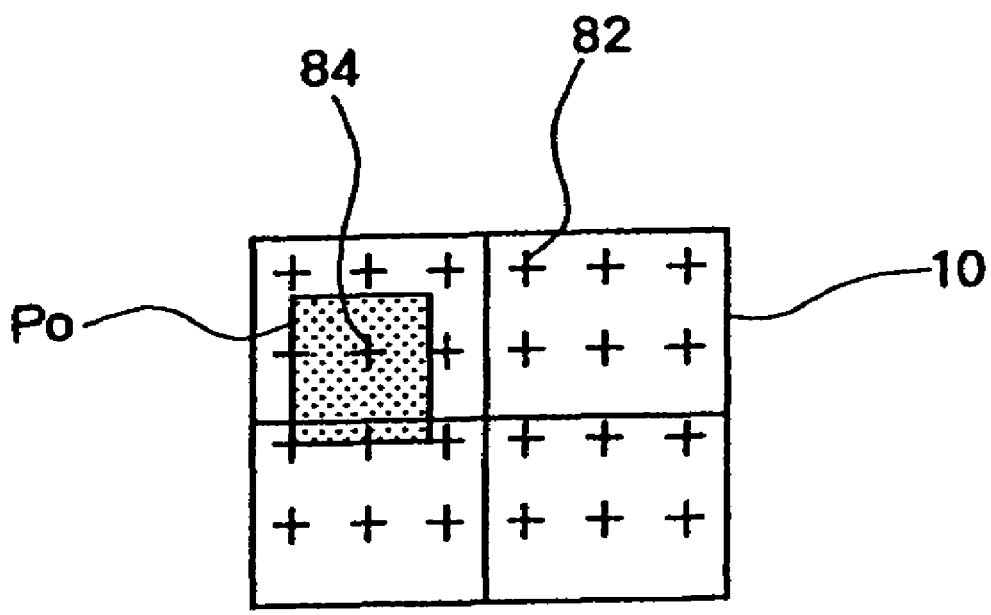
FIG. 23 shows how a plurality of rotational center points are set within the reference-image in Embodiment 4.

A plurality of rotational center points are set within this reference-image 10 (S60). The conditions of this setting are shown in FIG. 23. In this example, a plurality of rotational center points 82 are disposed at uniform intervals at a fixed spacing within the reference-image 10. The rotational center points can also be disposed within the positioning pattern $P_0$. Preferably, at least one rotational center point is disposed within the positioning pattern $P_0$. In FIG. 18, the rotational center point 84 is set within the positioning pattern $P_0$.

Next, for one rotational center point, a rotated image obtained by rotating the reference-image 10 +Q° about this point is produced (S62). Then, the amount of matching between the positioning pattern of the rotated image thus produced and the positioning pattern of the reference-image 10 is determined (S64). Assuming that each positioning pattern is a bonding pad, and that the brightness data is the same for all pixels, then it may be predicted that the amount of matching will be proportional to the overlapping area of the bonding pads. The steps S62 through S64 are performed for each rotational center point (S66 through S68).

Then, when the amounts of matching have been respectively determined for all of the rotational center points, the rotational center point showing the maximum amount of matching among these rotational center points is determined (S70). Generally, the rotational center point that is closest to the center of the positioning pattern $P_0$ shows the maximum amount of matching. The coordinates of this rotational center point showing the maximum amount of matching are specified as the coordinates of the reference conversion origin (S72). In the example shown in FIG. 23, the rotational center point 84 is specified as the reference conversion origin.

Depending on the manner in which the rotational center points are set, there may be instances in which no exceptional amount of matching is obtained, and the amounts of matching are close to even. In such cases, the rotational center point showing the maximum amount of matching may be tentatively extracted and the amounts of matching of the surrounding rotational center points may be compared, and the coordinates of a position that is recognized as being close to the center of the positioning pattern may be specified as the reference conversion origin. In this case, a specified range from the maximum value of the amount of matching is set, a rotational center point that is within this range or a rotational center point that is close to this range is specified, and this point may be specified as the reference conversion origin.

Compared to the method of Embodiment 3, the method of Embodiment 4 is easier in terms of the determination of the reference conversion origin, and can greatly reduce the calculation time.

The invention claimed is:

1. A computer readable medium storing a bonding program that detects each one of positions of a plurality of positioning patterns disposed on a chip that is an object of bonding, calculates positions of bonding pads that are in a specified positional-relationship with the plurality of positioning patterns, and performs bonding in calculated positions of said bonding pads, wherein said bonding program comprises:

a first reference-image acquisition process that makes an image of a first positioning pattern among a plurality of positioning patterns for a reference chip which is used as a reference for detection of positions of said positioning patterns, thus acquiring an image thus obtained as a first reference-image;

a first object-image acquisition process that makes an image of a first positioning pattern for a chip that is an object of bonding, thus acquiring an image thus as a first object-image;

a first positional-relationship calculation process that moves a first positioning pattern of said first reference-image and a first positioning pattern of said first object-image in relative terms so as to superimpose both of said images, so that a first positional-relationship which is a relative positional-relationship between a first positioning pattern of said reference chip and a first positioning pattern of said bonding object chip from an amount of said movement is calculated;

an inclination-angle calculation process that calculates an inclination-angle of the first positioning pattern of the bonding object chip with respect to the first positioning pattern in the reference chip;

a second reference-image acquisition process that makes an image of a second positioning pattern which is in a specified positional-relationship with the first positioning pattern for the reference chip, thus acquiring an image thus obtained as a second reference-image;

an imaging-position calculation process that calculates a second positioning pattern imaging-position in which a second positioning pattern is imaged for the chip that is an object of bonding, wherein said second positioning pattern imaging-position is calculated based upon the first positional-relationship, the inclination-angle, a specified inter-pattern positional-relationship and the imaging-position in the first object-image acquisition step;

a second object-image acquisition process that makes an image of a second positioning pattern for the bonding object chip in the calculated second positioning pattern imaging-position, thus acquiring the image thus obtained as a second object-image; and a second positional-relationship calculation process that moves the second reference-image end the second object-image in relative terms so as to superimpose the second positioning pattern of the second reference-image and the second positioning pattern of the second object-image, so that a second positional-relationship which is a relative positional-relationship between the second positioning pattern of the reference chip and the second positioning pattern of the bonding object chip from an amount of said movement is calculated; and positions of the bonding pads are calculated based upon the first positional-relationship and second positional-relationship, and bonding is performed.

2. The computer readable medium storing a bonding program according to claim 1, wherein said inclination-angle calculation process comprises:

a reference conversion origin specifying process that specifies a conversion origin that is used to subject the first reference-image to a polar coordinate conversion;

a reference-image conversion process that performs a polar coordinate conversion on the first reference-image by way of using a specified reference conversion origin, thus producing a post-conversion reference-image;

an object conversion origin specifying process that specifies the conversion origin that is used to subject the first object-image to a polar coordinate conversion by a positional-relationship that is the same as a positional-relationship between the first positioning pattern and the reference conversion origin in the first reference-image, based upon a calculated first positional-relationship;

an object-image conversion process that performs a polar coordinate conversion on the first object-image by way of using a specified object conversion origin, thus producing a post-conversion object-image; and a relative inclination-angle calculation process that moves the post-conversion object-image and post-conversion reference-image in relative terms on a angular axis so that the first positioning pattern that has been subjected to a polar coordinate development in the post-conversion object-image and the first positioning pattern that has been subjected to a polar coordinate development in the post-conversion reference-image are superimposed, so that a relative inclination-angle between the positioning pattern of the reference chip and the positioning pattern of the bonding object chip is calculated from an angular amount of said movement; and said reference conversion origin specifying process comprises:

a rotated image acquisition process that acquires a rotated image produced by rotating the first reference-image through a specified angle, and a pattern matching process that moves the first reference-image and the rotated image in relative terms, thus performing pattern matching so that the positioning pattern of the first reference-image and the positioning pattern of the rotated image are superimposed; and a reference conversion origin, which is such that an error in the relative positional-relationship between two positioning patterns detected by pattern matching of an image that is an object of comparison obtained by imaging-positioning patterns disposed in an attitude that includes positional deviation in a direction of rotation, and a first refrrence-image obtained by imaging-positioning patterns containing no positional deviation in a direction of rotation shows a minimal value, is specified, based upon results of the pattern matching.

* * * * *